(12) United States Patent
Konstantatos et al.

(10) Patent No.: US 9,349,888 B2
(45) Date of Patent: May 24, 2016

(54) PHOTOVOLTAIC NANOCOMPOSITE COMPRISING SOLUTION PROCESSED INORGANIC BULK NANO-HETEROJUNCTIONS, SOLAR CELL AND PHOTODIODE DEVICES COMPRISING THE NANOCOMPOSITE

(75) Inventors: Gerasimos Konstantatos, Barcelona (ES); Arup Kumar Rath, Barcelona (ES); Maria Bernechea Navarro, Barcelona (ES); Luis Martinez Montblanch, Barcelona (ES)

(73) Assignee: FUNDACIO INSTITUT DE CIENCIES FOTONIQUES (ES)

( * ) Notice: Subject to any disclaimer, the term of this patent is extended or adjusted under 35 U.S.C. 154(b) by 490 days.

(21) Appl. No.: 13/442,080

(22) Filed: Apr. 9, 2012

(65) Prior Publication Data

US 2013/0263918 A1  Oct. 10, 2013

(51) Int. Cl.
| | |
|---|---|
| *H01L 31/044* | (2014.01) |
| *H01L 31/0352* | (2006.01) |
| *H01L 31/0392* | (2006.01) |
| *H01L 31/072* | (2012.01) |
| *H01L 31/109* | (2006.01) |

(52) U.S. Cl.
CPC .... *H01L 31/035218* (2013.01); *H01L 31/0392* (2013.01); *H01L 31/072* (2013.01); *H01L 31/109* (2013.01); *Y02E 10/50* (2013.01)

(58) Field of Classification Search
CPC ........ H01L 31/00–31/208; Y02E 10/50–10/60
USPC ................................................. 136/243–265
See application file for complete search history.

(56) References Cited

U.S. PATENT DOCUMENTS

| | | | | |
|---|---|---|---|---|
| 2003/0145884 | A1* | 8/2003 | King et al. | 136/255 |
| 2004/0118448 | A1* | 6/2004 | Scher et al. | 136/252 |
| 2005/0284518 | A1* | 12/2005 | Yamada et al. | 136/262 |
| 2006/0243959 | A1 | 11/2006 | Sargent et al. | |
| 2009/0217973 | A1* | 9/2009 | Alivisatos et al. | 136/256 |
| 2009/0223566 | A1* | 9/2009 | Mitsui et al. | 136/263 |
| 2010/0326524 | A1* | 12/2010 | Ihn et al. | 136/261 |
| 2011/0146766 | A1 | 6/2011 | Nozik et al. | |

(Continued)

OTHER PUBLICATIONS

D. Aaron R. Barkhouse, "Thiols Passivate Recombination Centers in Colloidal Quantum Dots Leading to Enhanced Photovoltaic Device Efficiency", Article, ACS Nano, 2008, 2(11), 2356-2362, Publication Date (Web): Nov. 6, 2008, Downloaded from http://pubs.acs.org on Dec. 15, 2008.

(Continued)

*Primary Examiner* — Bach Dinh
(74) *Attorney, Agent, or Firm* — Cantor Colburn LLP

(57) ABSTRACT

Photovoltaic nanocomposite and solar cell device including the photovoltaic nanocomposite, where the photovoltaic nanocomposite includes a film of solution processed semiconductor materials having an n-type material selected from n-type quantum dots and n-type nanocrystals, and a p-type material selected from p-type quantum dots and p-type nanocrystals, and where the n-type material has a conduction band level at least equal, compared to vacuum level, to that of the p-type material, the p-type material has a valence band at the most equal, compared to vacuum level, to that of the n-type material. at least a portion of the n-type material and at least a portion of the p-type material are present in a bulk nano-heterojunction binary nanocomposite layer having a blend of the n-type material and the p-type material.

17 Claims, 14 Drawing Sheets

(56) References Cited

U.S. PATENT DOCUMENTS

2011/0308581 A1* 12/2011 Engelhart et al. ............. 136/252
2013/0087190 A1* 4/2013 Han et al. ...................... 136/256

OTHER PUBLICATIONS

Patrick R. Brown, "Improved Current Extraction from ZnO/PbS Quantum Dot Heterojunction Photovoltaics Using a MoO3 Interfacial Layer", ACS Publications, pubs.acs.org/NanoLett.
Jiang Tang, "Quantum Dot Photovoltaics in the Extreme Quantum Confinement Regime: The Surface-Chemical Origins of Exceptional Air- and Light-Stability", ACS Nano, vol. 4, No. 2, 869-878, 2010, www.acsnano.org.
Joshua J. Choi, "Solution-Processed Nanocrystal Quantum Dot Tandem Solar Cells", Adv. Mater. 2011, 23, 3144-3148.
Qijie Guo, "Synthesis of Cu2ZnSnS4 Nanocrystal Ink and Its Use for Solar Cells" J. Am. Chem. Soc. 2009, 131, 11672-11673.
Ilan Gur, "Air-Stable All-Inorganic Nanocrystal Solar Cells Processed from Solution", www.sciencemag.org Science vol. 310 Oct. 21, 2005, 462-465.
Jacek Jasieniak, "Solution-Processed Sintered Nanocrystal Solar Cells via Layer-by-Layer Assembly", 2011 American Chemical Society, Nano Letter 2011, 11, 2856-2864.
Keith W. Johnston, "Efficient Schottky-quantum-dot photovoltaics: The roles of depletion, drift, and diffusion", Applied Physics Letters 92, 122111-1 to 122111-3, (2008).
Dong-Kyun Ko, "Carrier Distribution and Dynamics of Nanocrystal Solids Doped with Artificial Atoms", Nano Lett. 2010, 10, 1842-1847.
Joseph M. Luther, "Schottky Solar Cells Based on Colloidal Nanocrystal Films" Nano Letters 2008 vol. 8, No. 10 3488-3492.
Joseph M. Luther, "Stability Assessment on a 3% Bilayer PbS/ZnO Quantum Dot Heterojunction Solar Cell" Adv. Mater. 2010, 22, 3704-3707.
Wanli Ma, "Photovoltaic Performance of Ultrasmall PbSe Quantum Dots", Article in American Chemical Society, www.acsnano.org.
Stefan D. Oosterhout, "The effect of three-dimensional morphology on the efficiency of hybrid polymer solar cells" Nature Materials, vol. 8, Oct. 2009, pp. 818-824 www.nature.com/naturematerials.
Matthew G. Panthani, "Synthesis of CuInS2, CuInSe2, and Cu(InxGa1-x)Se2 (CIGS) Nanocrystal "Inks" for Printable Photovoltaics", J. Am. Chem. Soc. 2008, 130, 16770-16777.
Andras G. Pattantyus-Abraham, "Depleted-Heterojunction Colloidal Quantum Dot Solar Cells", Article, ACS Nano, vol. 4, No. 6, 3374-3380, 2010.
Arup K. Rath, Solution-Processed Heterojunction Solar Cells Based on p-type PbS Quantum Dots and n-type Bi 2 S 3 Nanocrystals, Adv. Mater. 2011, pp. 1-6.
Shenqiang Ren, "Inorganic Organic Hybrid Solar Cell: Bridging Quantum Dots to Conjugated Polymer Nanowires", Nano Lett. 2011, 11, 3998-4002.
Dmitri V. Talapin, "PbSe Nanocrystal Solids for n- and p-Channel Thin Film Field-Effect Transistors" Oct. 7, 2005 vol. 310 Science www.sciencemag.org, pp. 86-89.
Jiang Tang, "Colloidal-quantum-dot photovoltaics using atomic-ligand passivation", Nature Materials, vol. 10, Oct. 2011, www.nature.com/naturematerials, pp. 765-771.
Jeffrey J. Urban, "Synergism in binary nanocrystal superlattices leads to enhanced p-type conductivity in self-assembled PbTe/Ag2Te thin films", nature materials vol. 6 Feb. 2007 www.nature.com/naturematerials, pp. 115-121.
Xihua Wang, "Tandem colloidal quantum dot solar cells employing a graded recombination layer" Article, Nature Photonics | Advance Online Publication www.nature.com/naturephotonics.
G. Yu, "Polymer Photovaltaic Cells: Enhanced Efficiencies via a Netwirk of Internal Donor-Acceptor Heterojunctions", Science, New Series, vol. 270. No. 5243 (Dec. 15, 1995) pp. 1789-1791.
Mahapatra et al.; "Photoelectrochemical Behaviour of Electrodeposited and Pressure-Sintered Bi2S3,Bi2S3—PbS and Bi2S3—Ag2S"; Solar Cells; 7; pp. 225-232; (1982).
Moreno-Garcia et al.; "All-chemically Deposited Bi2S3/PbS Solar Cells"; Thin Solid Films; 519; pp. 7364-7368; (2011).

* cited by examiner

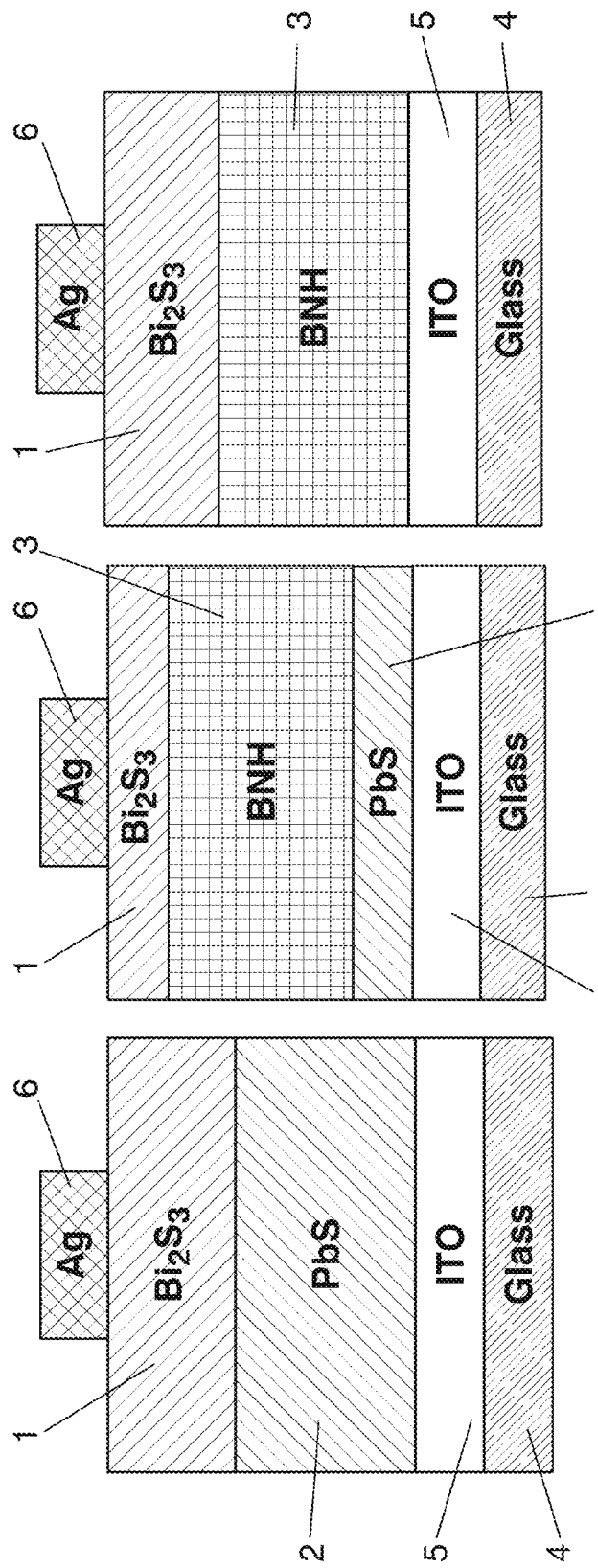

PHOTOVOLTAIC NANOCOMPOSITE COMPRISING SOLUTION PROCESSED INORGANIC BULK NANO-HETEROJUNCTIONS, SOLAR CELL AND PHOTODIODE DEVICES COMPRISING THE NANOCOMPOSITE

TECHNICAL FIELD OF THE INVENTION

The present invention lies within the technical field of thin film photovoltaics and particularly to solution processed quantum dot and nanocrystal films and to therefrom made solar cells.

BACKGROUND OF THE INVENTION

Solution processed quantum dot (QD)/nanocrystal (NC) solar cells have emerged in the last decade as a very promising technology for third-generation thin film photovoltaics due to their low cost and high energy harnessing potential. A variety of quantum dot solar cell architectures have been developed, however, all reports so far have relied on the employment of bulk-like thin films of colloidal quantum dots. This has limited the material availability to nanomaterials that exhibit the favorable property of long carrier lifetime evidenced in Pb-based and Cd-based quantum dots.

Solution processed inorganic solar cells based on colloidal quantum dots and nanocrystals have attracted tremendous interest in view of their potential for panchromatic solar harnessing from the visible to the infrared and their low fabrication cost associated with solution processing (Luther, J. M. et al. Schottky solar cells based on colloidal nanocrystal films. Nano Lett. 8, 3488-3492 (2008); Ma, W. et al. Photovoltaic performance of ultrasmall PbSe quantum dots. Acs Nano 5, 8140-8147 (2011); Pattantyus-Abraham, A. G. et al. Depleted-heterojunction colloidal quantum dot solar cells. Acs Nano 4, 3374-3380 (2010); Brown, P. R. et al. Improved current extraction from ZnO/PbS quantum dot heterojunction photovoltaics using a $MoO_3$ interfacial layer. Nano Lett. 11, 2955-2961, (2011)). Solution processed inorganic thin-film solar cells consist of either nanocrystalline bulk semiconductors based on CdTe (Jasieniak, J., MacDonald, B. I., Watkins, S. E. & Mulvaney, P. Solution-processed sintered nanocrystal solar cells via layer-by-layer assembly. Nano Lett. 11, 2856-2864 (2011)), CIGS (Panthani, M. G. et al. Synthesis of $CuInS_2$, $CuInSe_2$, and $CuIn_xGa_{1-x}Se_2$ (CIGS) nanocrystal "Inks" for printable photovoltaics. J. Am. Chem. Soc. 130, 16770-16777 (2008)) or CZTS (Guo, Q., Hillhouse, H. W. & Agrawal, R. Synthesis of $Cu_2ZnSnS_4$ nanocrystal ink and its use for solar cells. J. Am. Chem. Soc. 131, 11672-11673 (2009)) or nanocrystalline quantum confined systems based on Pb(S, Se) Luther, J. M. et al. Schottky solar cells based on colloidal nanocrystal films. Nano Lett. 8, 3488-3492 (2008); Ma, W. et al. Photovoltaic performance of ultrasmall PbSe quantum dots. Acs Nano 5, 8140-8147 (2011); Pattantyus-Abraham, A. G. et al. Depleted-heterojunction colloidal quantum dot solar cells. Acs Nano 4, 3374-3380 (2010); Brown, P. R. et al. Improved current extraction from ZnO/PbS quantum dot heterojunction photovoltaics using a $MoO_3$ interfacial layer. Nano Lett. 11, 2955-2961, (2011); Luther, J. M. et al. Stability assessment on a 3% bilayer PbS/ZnO quantum dot heterojunction solar cell. Adv. Mater. 22, 3704-3707 (2010); Tang, J. et al. Quantum dot photovoltaics in the extreme quantum confinement regime: the surface-chemical origins of exceptional air- and light-stability. Acs Nano 4, 869-878 (2010)) and Cd(Se, S, Te) (Gur, I., Fromer, N. A., Geier, M. L. & Alivisatos, A. P. Air-stable all-inorganic nanocrystal solar cells processed from solution. Science 310, 462-465, (2005)) quantum dots. Quantum dots offer the potential of bandgap tunability for more efficient solar harnessing (Wang, X. et al. Tandem colloidal quantum dot solar cells employing a graded recombination layer. Nature Photon. 5, 480-484 (2011); Choi, J. J. et al. Solution-processed nanocrystal quantum dot tandem solar cells. Adv. Mater. 23, 3144-3148 (2011). However, only a small fraction of available semiconductor materials has been exploited for the development of third-generation thin-film solar cells. An important criterion in the selection of material candidates for solar cells is the carrier lifetime: carrier lifetime should be long enough to allow for efficient diffusion and drift of photogenerated carriers to the metal contacts before they recombine. In the case of solution processed quantum dot devices, Pb(S, Se) quantum dots outperform any other material to date thanks to the carrier lifetime offered from favorably shallow traps that allow for efficient exciton dissociation and recombination quenching (Barkhouse, D. A. R., Pattantyus-Abraham, A. G., Levina, L. & Sargent, E. H. Thiols passivate recombination centers in colloidal quantum dots leading to enhanced photovoltaic device efficiency. Acs Nano 2, 2356-2362 (2008)). This has been exploited in various solar cell structures developed to date that rely on the existence of a bulk-state thin film of colloidal quantum dots where carrier photogeneration and bipolar transport occur in the same medium. This has yielded devices with efficiencies steadily increasing from 2% (Luther, J. M. et al. Schottky solar cells based on colloidal nanocrystal films. Nano Lett. 8, 3488-3492 (2008)) up to 6% (Tang, J. et al. Colloidal-quantum-dot photovoltaics using atomic-ligand passivation. Nature Mater. 10, 765-771 (2011)) over the past years as a result of increasing carrier mobility and depletion width followed by complex chemistry surface engineering that yields low doping concentration (Tang, J. et al. Colloidal-quantum-dot photovoltaics using atomic-ligand passivation. Nature Mater. 10, 765-771 (2011)). However this elaborate control of carrier doping has thus far been limited mainly in PbS QDs, a well-studied material thanks to its favorably long carrier lifetime.

A bulk heterojunction concept has been employed in polymer-based solar cells as the sole way for exciton dissociation and diffusion to compete with ultra-fast recombination and short exciton diffusion length (Yu, G., Gao, J., Hummelen, J. C., Wudl, F. & Heeger, A. J. Polymer photovoltaic cells-enhanced efficiencies via a network of internal donor-acceptor heterojunctions. Science 270, 1789-1791, (1995); Oosterhout, S. D. et al. The effect of three-dimensional morphology on the efficiency of hybrid polymer solar cells. Nature Mater. 8, 818-824, (2009)). Efforts to reproduce the benefits of this structure in polymer-nanocrystal hybrid solar cells has not fulfilled the expectations due to the challenges of achieving the appropriate nanomorphology for efficient exciton dissociation and carrier transport in these heterogeneous nanocomposites. It was only recently that polymer-grafted quantum dot hybrid solar cells with controlled nanostructure led to efficiency improvement in hybrid polymer-quantum dot solar cells (Ren, S. et al. Inorganic-organic hybrid solar cell: bridging quantum dots to conjugated polymer nanowires. Nano Lett. 11, 3998-4002 (2011)).

The development of an inorganic bulk heterojunction based on PbS QDs and titania meso-structured electrodes has been reported in a depleted heterostructure. However the reported devices relied on the employment of a meso-structured electrode that does not contribute in light absorption (Barkhouse, D. A. R. et al. Depleted bulk heterojunction colloidal quantum dot photovoltaics. Adv. Mater. 23, 3134-3138 (2011)). The scale of the reported heterojunction was on the order of 100 nm resulting in modest increase in power conversion efficiency compared to their bilayer counterparts (Pattantyus-Abraham, A. G. et al. Depleted-heterojunction colloidal quantum dot solar cells. *Acs Nano* 4, 3374-3380 (2010)).

US-2011/0146766-A1 discloses solar cells comprising a nanocrystal film of a single material such as a quantum dot material, a colloidal nanocrystal material or a combination thereof, arranged between a first and a second electrode.

US-2006/0243959-A1 discloses three-dimensional bicontinuous heterostructures including two interpenetrating, spatially continuous layers including protrusions or peninsulas but no islands. A first of the two layers is made of a first material and the second of the two layers is made of second material. One of the materials includes visible and/or infrared semiconducting quantum dot nanoparticles and one of the materials is a hole conductor and the other an electron conductor.

US-2009/0217973-A1 discloses a photovoltaic device comprising an inorganic photoactive layer disposed between electrode layers and comprising two heterojunctioned populations of nanostructures of different inorganic materials.

The photovoltaic efficiency of the thin-film based solution processed quantum dot (QD)/nanocrystal (NC) solar cells known from prior art is still improvable and, further, the techniques used to prepare such films is rather cumbersome.

DESCRIPTION OF THE INVENTION

The present invention is intended to overcome the afore mentioned drawbacks of prior art by providing a photovoltaic nanocomposite and a solar cell device comprising the photovoltaic nanocomposite.

According to the invention, the photovoltaic nanocomposite comprises a film of solution processed semiconductor materials comprising a n-type material selected from n-type quantum dots and n-type nanocrystals, and a p-type material selected from p-type quantum dots and p-type nanocrystals, wherein the n-type material has a conduction band level at least equal, compared to vacuum level, to that of the p-type material, the p-type material has a valence band at the most equal, compared to vacuum level, to that of the n-type material.

at least a portion of the n-type material and at least a portion of the p-type material are present in a bulk nano-heterojunction binary nanocomposite layer comprising a blend of the n-type material and the p-type material.

The p-type material and the n-type material may be present in a proportion enabling formation of a continuous percolation path in both layers along the two phases, the proportion depending on the doping concentration of the p-type and n-type nanocrystals as well as their difference in the atomic mass. Thus, the p-type material and the n-type material may be present in a proportion of 1:100 to 100:1 by weight and depending on the materials used, in a proportion of 1:3 to 3:1. Preferably, the nanocomposite has a carrier doping density lower than carrier doping densities of any of the n-type material and the p-type material comprised in the hole blocking layer and in the electron blocking layer, such that a nearly intrinsic layer is formed and a p-i-n structure is developed.

The n-type material may selected from n-type nanocrystals made of any of semiconductors selected from $Bi_2S_3$, $FeS_2$ (pyrite), FeS, iron oxide, ZnO, $TiO_2$, copper sulfide, PbS, PbSe, PbTe, CdSe, CdS, Si, Ge, copper zinc tin sulfide (CZTS), and copper indium gallium diselenide (CIGS). On the other hand, the p-type material may be selected from PbS, PbSe, PbTe, $Cu_2O$, CZTS, CIGS, Si, Ge, copper sulfide, $FeS_2$ and FeS.

In a preferred embodiment of the invention, the photovoltaic nanocomposite comprises a trilayer structure where the nanocomposite layer sandwiched between an electron blocking layer of a p-type material and a hole blocking layer of a n-type material. According to this preferred embodiment, the electron blocking layer may have a thickness ranging from 10 to 500 nm, the hole blocking layer may have a thickness ranging from 10 to 500 nm, and the nanocomposite layer may have a thickness ranging from 100 to 2000 nm.

The nanocomposite may have a carrier doping density which is lower than the corresponding doping densities of the individual constituent semiconductor materials The n-type material in the hole blocking layer may be of the same material as the n-type material in the nanocomposite layer, or the n-type material in the hole blocking layer may be different from the n-type material in the nanocomposite layer. Also, the p-type material in the electron blocking layer may be of the same material as the p-type material in the nanocomposite layer, or the p-type material in the electron blocking layer may be different from the p-type material in the nanocomposite layer.

When the n-type material in the hole blocking layer is the same material as the n-type material in the nanocomposite layer, the n-type material in the hole blocking layer preferably has a carrier doping density at least as large as that of the n-type material in the nanocomposite layer. Otherwise, when the n-type material in the hole blocking layer is a n-type material different from the n-type material in the nanocomposite layer, the n-type material in the hole blocking layer preferably has a conduction band at least as large as that of that of the n-type material in the nanocomposite layer and a valence band at the most as large as that of both the p-type and n-type materials in the nanocomposite layer.

On the other hand, when the p-type material in the electron blocking layer is the same material as the p-type material in the nanocomposite layer, the p-type material in the electron blocking layer preferably has a carrier doping density at least as large as that of the p-type material in the nanocomposite layer. When the p-type material in the electron blocking layer is a p-type material different from the p-type material in the nanocomposite layer, the p-type material in the electron blocking layer preferably has a valence band at the most as large as that of that of the p-type material in the nanocomposite layer and a conduction band at the most as large as that of both the p-type and n-type materials in the nanocomposite layer.

With the photovoltaic nanocomposite of the present invention, carrier lifetime can be significantly prolonged in a semiconductor material by the formation of a bulk heterojunction at the nanoscale which allows efficient charge separation and transport. Formation of binary nanocomposite semiconductor allows does not only provide control of the photogenerated carrier lifetimes but also of the doping level, thereby opening a way toward novel optoelectronic materials whose electronic properties can be tailored simply by the concentration of the constituent individual components. Well known basic components such as PbS QDs as a p-type component and $Bi_2S_3$ NCs as the n-type semiconductor may be employed, where a bulk nano-heterojunction ("BNH") structure shows an over three-fold improvement in power conversion efficiency (PCE) compared to a bilayer p-n junction made of the same materials. This improvement is followed by a corresponding increase in carrier lifetime as a result of efficient charge separation and transport at the nanoscale.

Moreover, this has been achieved by employing an entirely low-temperature process (up to 100° C.) as opposed to high temperatures (>400° C.) required in previous reports of CQD heterojunctions based on n-type titania electrodes. This is of high importance in low-cost large-scale manufacturing based on roll-to-roll processing.

The solar cell device according to the invention comprises a substrate, a bottom electrode layer coated on the substrate, a photovoltaic nanocomposite comprising a film of solution processed semiconductor materials comprising a n-type material selected from n-type quantum dots and n-type nanocrystals, and a p-type material selected from p-type quantum dots and p-type nanocrystals, coated on the electrode layer, and at least one top electrode provided on the film, wherein the film is a photovoltaic nanocomposite as described above.

The bottom electrode layer is a layer of the solar cell is preferably made of a transparent conductive material such as, for example, indium tin oxide, aluminum doped tin oxide or graphene. In turn, the top electrode is made of an electrode material such as silver, gold, molybdenum, molybdenum oxide, AZO, ITO, Ni, Al, Cu, tungsten, and combinations thereof.

In a preferred embodiment, the solar cell device further comprises an interfacial ultrathin buffer layer introduced between the film and the top electrode to facilitate passivation of the interface and suppression of recombination. The buffer layer may have thickness from 0.1 to 3 nm and be made of ZnO, $TiO_2$, LiF or $MoO_x$.

The present invention also refers to a photodiode device which is characterized in that it comprises the above described nanocomposite. This photodiode device is useful to detect light operated at V bias as a photovoltaic detector or at reverse bias as a photodiode. The photodiode device can be employed to detect photons with energies ranging from the X-ray to infrared. The sensitivity of the detector is determined by the bandgap of the constituent semiconducting nanocrystals. For example: PbS, $Bi_2S_3$ or CdTe nanocrystals can be used for x-ray detection, PbS, PbSe, $Bi_2S_3$, $Cu_2S$, etc. can be used for visible and near infrared light detection and HgTe or CdHgTe nanocrystals can be employed for mid-IR detection applications.

The bulk nano-heterojunction (BNH) concept for inorganic solution processed semiconductors is a novel architecture for efficient solution-processed solar cells. This architectural platform can be very easily implemented by mixing different semiconductor nanocrystals in solution and allows for the development of optoelectronic nanocomposite materials with tailored optoelectronic properties. Photogenerated carrier separation at the nanoscale leads to suppressed recombination and prolongation of carrier lifetime—a most-favorable property in search for novel solar cell semiconductor materials. BNH solar cells based on n-type $Bi_2S_3$ NCs and p-type PbS QDs have shown an over 3-fold improvement in device performance compared to their bilayer analogue.

The nanocomposite according to the present invention may be prepared by mixing a first solution comprising the n-type nanocrystals and a solvent, with a second solution of the p-type quantum dots and solvent, and drying the so obtained mixture to obtain the binary bulk nano-heterojunction nanocomposite layer.

A process for preparing the solar cell device of the invention comprising the above described trilayer structure where the nanocomposite layer is sandwiched between an electron blocking layer of a p-type material and a hole blocking layer of a n-type material involves the steps of obtaining a layered structure by depositing a lower film of a solution of p-type or n-type material on the bottom electrode arranged on the substrate, depositing a nanocomposite film comprising a blend of a solution of the n-type material and a solution of the p-type material onto the lower film, and depositing an upper film of a solution of n-type material or p-type material onto the nanocomposite film, subjecting the so obtained layered film structure to a post-annealing treatment, and providing the top electrode.

The solvent in any of the above mentioned solutions can be any organic solvent, as for example toluene, chloroform, chlorobenzene, dichlorobenzene, octane, heptane, hexane and combinations thereof.

The lower layer is deposited by a spincasting or spray casting technique followed by an in situ ligand exchange process to replace long insulating ligands for shorter ligands to obtain the lower film having a thickness of preferably 10 to 100 nm. The nanocomposite layer is also deposited by a spincasting or spray casting technique followed by an in situ ligand exchange process to replace long insulating ligands for shorter ligands to obtain the nanocomposite film having a thickness of preferably 100 to 1000 nm. The upper layer is as well deposited by a spincasting or spray casting technique followed by an in situ ligand exchange process to replace long insulating ligands for shorter ligands to obtain the upper film having a thickness of preferably 10 to 100 nm.

In the formation of the lower film, the nanocomposite film and the upper film, the ligand exchange process cab takes place in situ during spincoating according to which the deposited layers are exposed in solutions of non-solvents (such as acetone, methanol, isopropanol, acetonitrile) which contain amounts of the short ligands at a concentration of 10 mM to 1M. The ligands may be any or combinations of organic compounds as ethanethiol, butanethiol, propanethiol, octanethiol, butylamine, formic acid, ethanedithiol, butanedithiol, propanedithiol, ethylenediamine, hydrazine, oxalic acid, mercaptopropionic acid, malonic acid, or inorganic compounds such as $NH_3S_2$ or SCN or be comprised of metal free ligands such as: S2-, HS—, Se2-, HSe—, Te2-, HTe—, TeS32-, OH—, and NH2-.

The spincasting and layer-by-layer deposition is a technique that involves repeated steps of nanocrystal deposition from solution and ligand exchange process (as described above) during spincasting. Each step usually yields a thin-film of 20-30 nm and by repeating steps films as thick as 1000 nm can be grown.

In the post-annealing treatment, the layered structure is subjected to a mild annealing treatment for 1 minute to 30 minutes at a temperature ranging from 50-150° C., preferably around 90-100° C., under inert conditions (e.g. in a nitrogen or argon atmosphere) or under ambient conditions.

The top electrode may be provided by evaporating or sputtering a metal contact onto the annealed upper film, and subjecting the structure comprising the substrate, bottom electrode and annealed film structure to a further post annealing treatment under inert conditions (e.g. in an argon or nitrogen atmosphere) or high vacuum conditions (pressure ranges from $10^{-3}$-$10^{-7}$ Torr) for a duration that may range from 1 minute-30 minutes at a temperature that may range from 50-150° C. (preferably around 90-100° C.).

BRIEF DESCRIPTION OF THE DRAWINGS

Hereinafter, aspects and embodiments of the invention will be described on the grounds of drawings wherein

FIG. 9A is a schematic view of a bilayer device used for the determination of carrier lifetime and $J_{sh}$ intensity dependence at laser excitation of 980 nm;

FIG. 9B is a schematic view of a BNH device used for the determination of carrier lifetime and $J_{sh}$ intensity dependence at laser excitation of 980 nm;

FIG. 9C is a schematic view of a control device used for the determination of carrier lifetime and $J_{sh}$ intensity dependence at laser excitation of 980 nm;

Figure 1A:
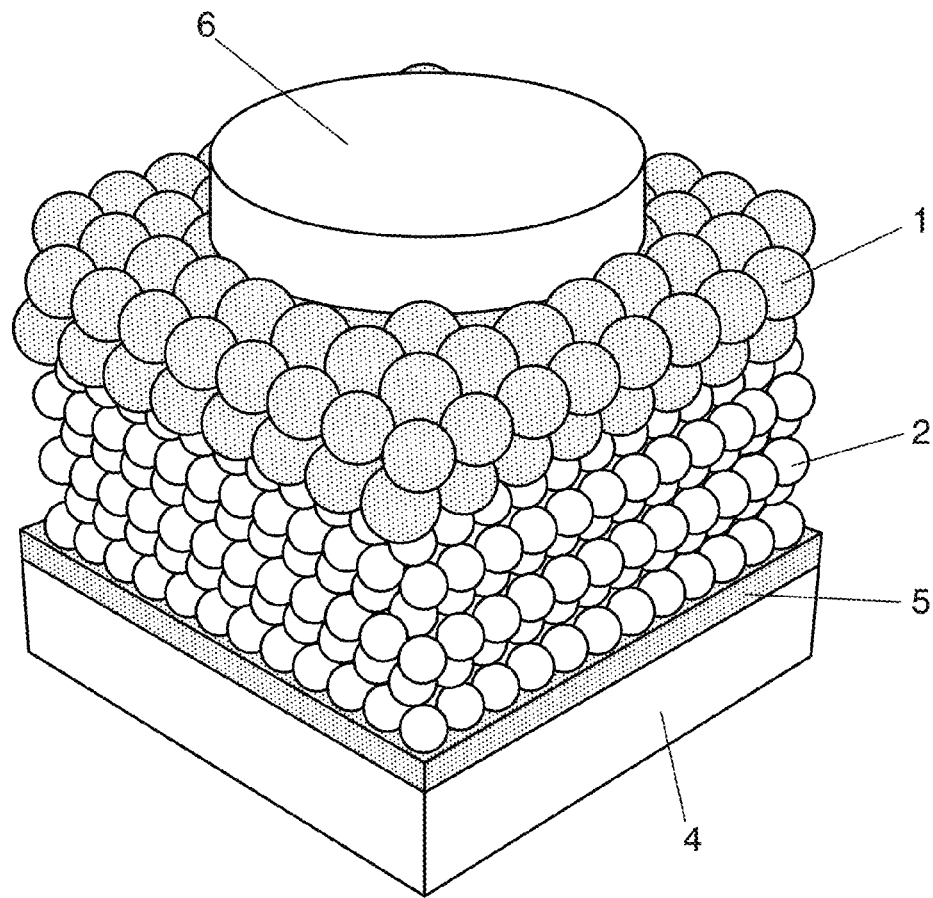
FIG. 1A is schematic view of a solar cell comprising a bilayer structure known from prior art.

In these figures, there are references identifying the following elements 1 n-type material
1a hole blocking layer
2 p-type material
2a electron blocking layer
3 nanocomposite layer
4 substrate
5 bottom electrode layer
6 top electrode later
7 buffer layer

EMBODIMENTS OF THE INVENTION

For nanocrystal synthesis, all reactions as described hereinafter were carried out using standard Schlenk techniques. Reagents were purchased from SIGMA ALDRICH, except $Bi(OAc)_3$ which was purchased from ALFA AESAR.

Synthesis of $Bi_2S_3$ NCs was performed in the following manner 5.4 mmol of $Bi(OAc)_3$, 34 mmol of oleic acid (OA) and 34 mmol of 1-octadecene (ODE) were pumped overnight at 100° C. After this time, the reaction temperature was raised to 170° C. When the reactions flask reaches this temperature 1.2 mmol of HMS (hexamethyldisilathiane) mixed with 10 ml of ODE were quickly injected to the flask and the heating temperature was lowered to 100° C. After 2 h at 100° C. the reaction was quenched by removing the heating mantle and adding 20 ml of cold toluene and 40 ml of cold methanol. The oleate caped $Bi_2S_3$ nanocrystals were isolated after centrifugation. Purification of the nanocrystals was performed by successive dispersion/precipitation in toluene/MeOH. Finally the nanocrystals were dispersed in anhydrous toluene.

Synthesis of PbS QDs was carried out in the following manner: 2 mmol of PbO, 4 mmol of OA and 8 mmol of ODE were pumped overnight at 95° C. After this time, 15 ml of ODE were added and the temperature of the reaction was raised to 120° C. When this point was reached, 1 mmol of TMS mixed with 10 ml of ODE were quickly injected. The heating was stopped (without removing the heating mantle) and the reaction was allowed to cool down slowly (~60 min). The nanocrystals were isolated by addition of acetone and centrifugation, purified by dispersion/precipitation with toluene/acetone and finally dispersed in anhydrous toluene.

Solar cell device were fabricated as follows: Patterned ITO coated glass substrates (15 ohm/sq) were purchased from KINTECH COMPANY and were cleaned with acetone, ethanol and DI water under sonication 10 minutes each in sequence before use. Substrates were then dipped in a 0.2M solution of (3-Mercaptopropyl)methyldimethoxysilane and ethanedithiol mixed at a ratio of 1:1 in Toluene for 12 hours to improve adhesion of nanocrystal layers on the substrates. Oleic acid caped PbS nanocrystals were first ligand exchanged with Oleylamine as described by Tang, J. et al. Quantum dot photovoltaics in the extreme quantum confinement regime: the surface-chemical origins of exceptional air- and light-stability. *Acs Nano* 4, 869-878 (2010). PbS stock solution was then prepared at a concentration of 30 mg/mL in Toluene, $Bi_2S_3$ stock solution was prepared at a concentration of 25 mg/mL in Toluene and blends of PbS and $Bi_2S_3$ were prepared by mixing them at different weight ratios while keeping the final concentration of 25 mg/mL in toluene. Film deposition and ligand exchange were carried out inside a fume hood by layer by layer technique. One drop of nanocrystal was spin-casted at 2,000 rpm for 30 s. The film was then treated with 2 drops of 2% (v/v in acetonitrile) ethanedithiol (EDT), 2 drops of acetonitrile and 2 drops of toluene at the same rotating speed. The sequence was repeated to get the desired film thickness. PbS, $Bi_2S_3$ and EDT solution were spin casted by passing them through 0.2 μm filter but the blend solutions were casted without filtration. The as synthesized films were kept in vacuum for 48 hours and annealed at 80° C. for 10 minutes inside glove box. Metal deposition was carried out on KURT J. LESKER NANO 36 SYSTEM at a rate of 2 Ås$^{-1}$ at a base pressure lower than $2\times10^{-6}$ mbar. Final thickness was controlled together with deposition rate monitoring via a quartz crystal. A shadow mask with stripes 2.5 cm length×2 mm width aligned perpendicular to the patterned ITO. Device area was determined by the overlap of the ITO and metal electrode structures and was 4 mm$^2$. The devices were then annealed at 100° C. for 3 minutes inside glove-box before they were characterized.

All device characterization was performed in ambient conditions. The current-voltage characteristics were recorded using KEITHLY 2400 source meter. Illumination intensity of AM 1.5 was accomplished using a solar simulator (NEWPORT 96000). A shadow mask was placed just before our device so that incident light area closely matches with the device area. For EQE measurement, devices were illuminated by a NEWPORT CORNERSTONE 260 monochromator and the short circuit current was measured directly using KEITHLEY 2400 unit at a step of 10 nm. Total absorption of our films were carried out using a CARY 5000 UV-VIS-NIR spectrophotometer with an integrating sphere to calculate IQE of our devices form their EQE spectrum. Capacitance-voltage characteristics were performed using an AGILENT E4980A LCR meter. NEWPORT LQA635-08C control by an AGILENT 33220A waveform generator for 635 nm laser and fiber coupled 980 nm single mode laser module controlled by ITC4000 (THORLAB) for 980 nm laser were used to apply pulses and continuous illumination in our devices. An Oscilloscope of TEKTRONIX, TDS 2024B coupled with the laser sources were used to get the transient open circuit voltage spectrums. Cross-sectional SEM images of our devices were taken using ZEISS AURIGA cross-beam workstation and the images were taken at voltage 5 kV and aperture size 30 μm using INLENS detector.

Figure 1B:
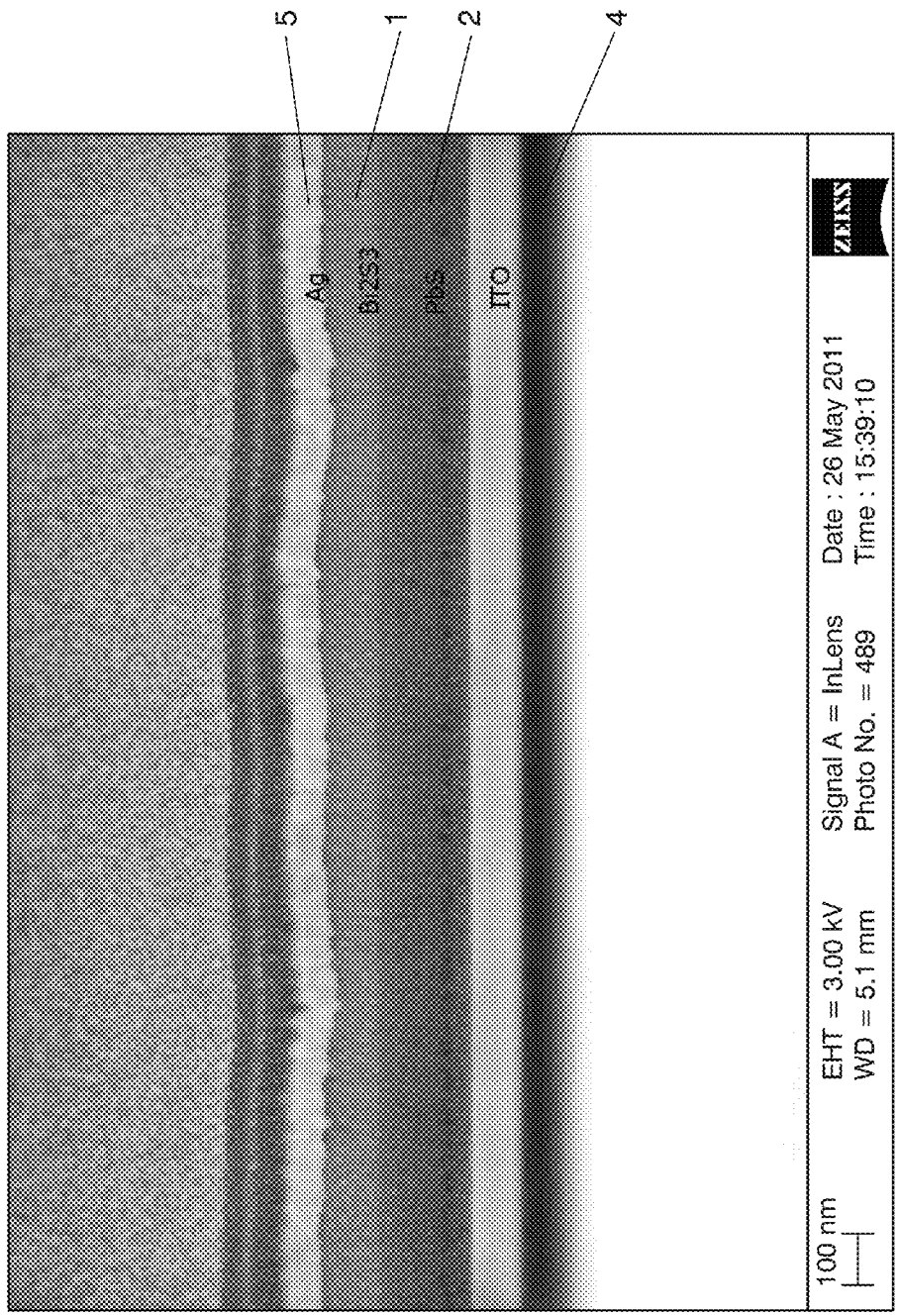
FIG. 1B is a cross sectional secondary electrons (SEM) micrograph of an experimental solar cell comprising a know bilayer nanocomposite.

FIGS. 1A and 1B show a bilayer device which consists of a p-type semiconductor layer of p-type PbS quantum dots ("QDs") -1-, and a n-type semiconductor layer -1- of n-type $Bi_2S_3$ nanocrystals ("NCs") forming a planar p-n heterojunction. A bottom electrode layer -5- of indium tin oxide (ITO") is coated on a substrate -4-. The p-type semiconductor layer -1- is arranged on the bottom electrode layer -5- and a silver top electrode -6- is arranged on the n-type semiconductor layer -1-.

Figure 2A:
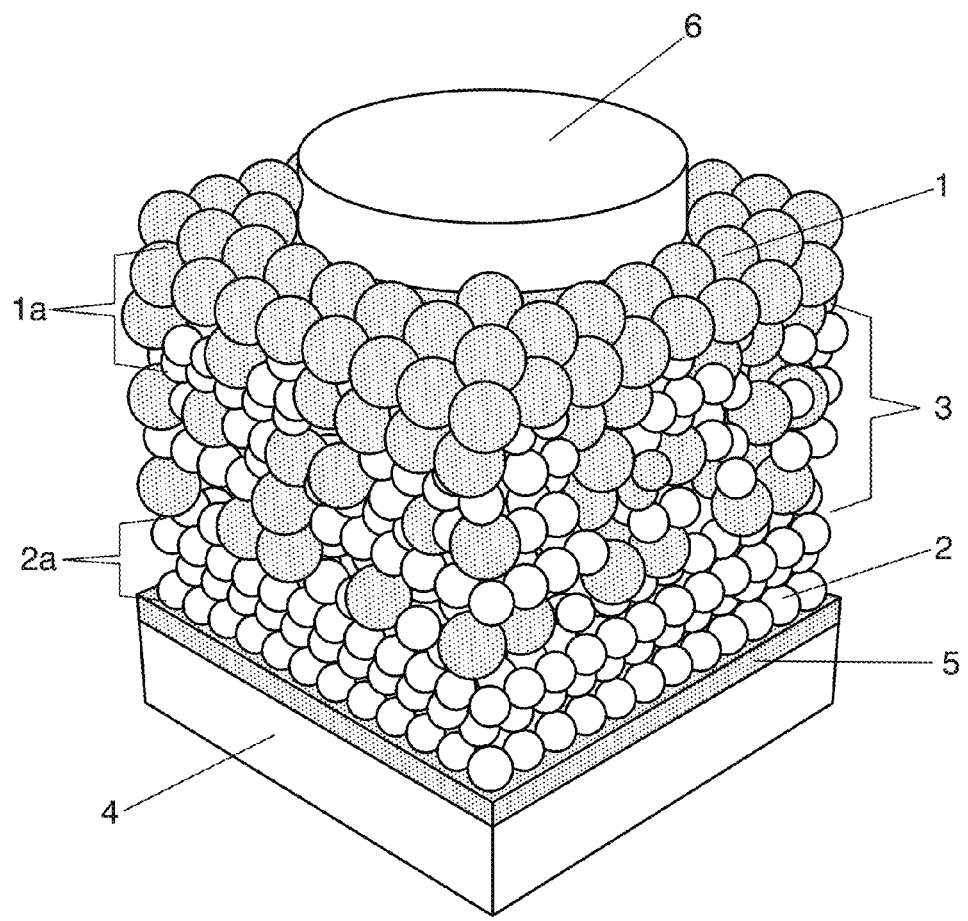
FIG. 2A is schematic view of an embodiment of a solar cell comprising an embodiment of the photovoltaic bulk nano-heterojunction binary ("BNH") nanocomposite layer of the present invention.
Figure 2B:
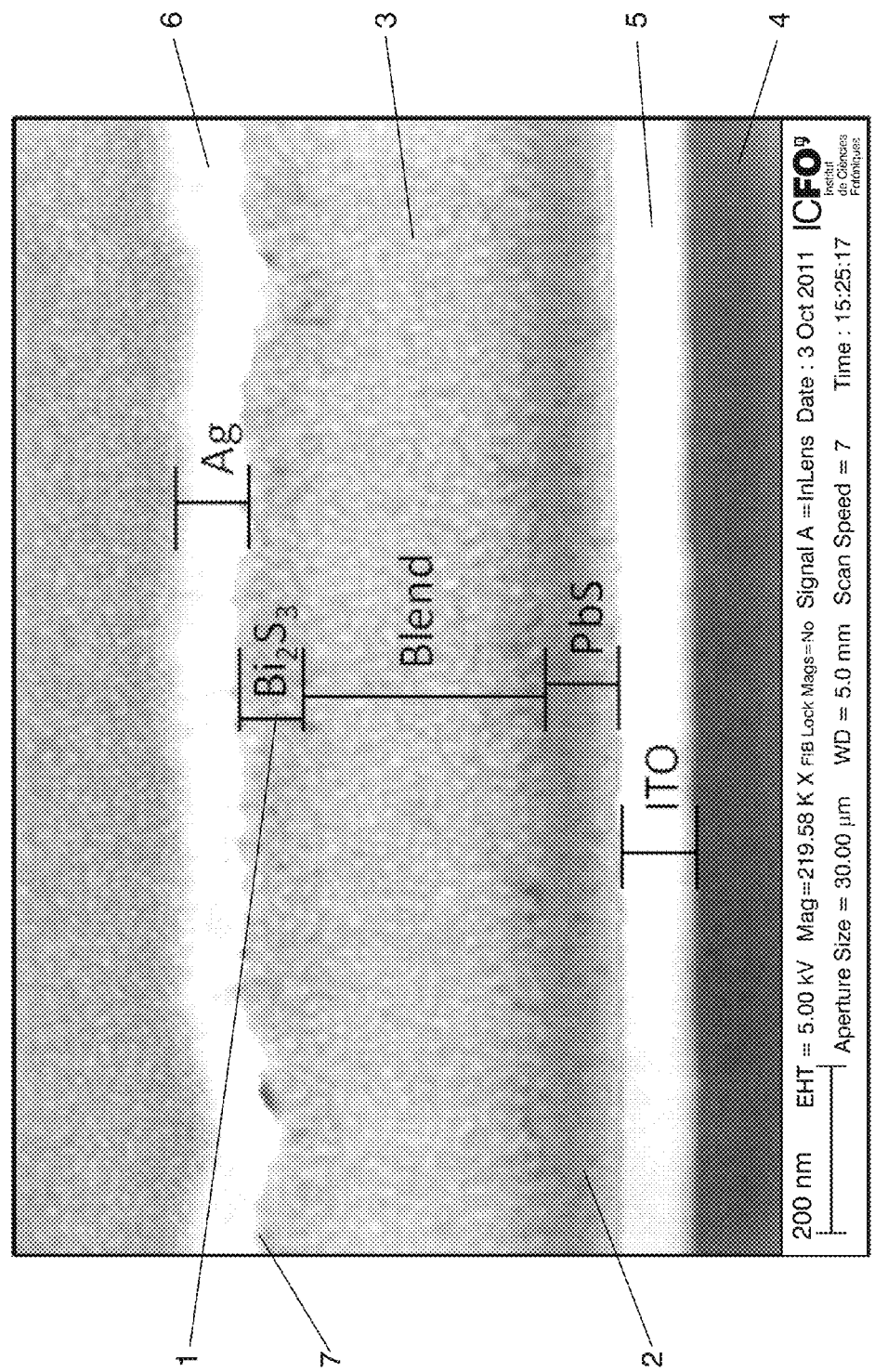
FIG. 2B is a cross sectional secondary electrons (SEM) micrograph of an experimental solar cell in accordance with the present invention.

FIGS. 2A and 2B show an embodiment of a solar cell device in accordance with the invention. As apparent, the device of the invention differs from the known device of FIG. 1 in that it is a trilayer structure where a portion of the n-type material -1- and at least a portion of the p-type material -2- are present in a bulk nano-heterojunction binary nanocomposite layer -3- comprising a blend of the n-type material and the p-type material. The nanocomposite layer -3- is sandwiched between an electron blocking layer -2a- of the p-type material, particularly PbS QDs, and a hole blocking -1a-layer of the n-type material, particularly $Bi_2S_3$ NCs. The n-type material -1- has a conduction band level at least equal, compared to vacuum level, to that of the p-type material -2-, whilst the p-type material -2- has a valence band at the most equal, compared to vacuum level, to that of the n-type material -1-. The nanocomposite layer -3- comprises a As apparent from FIGS. 1B and 2B which are cross sectional secondary electrons microscope (SEM) micrographs of the afore described structures, the p-n junction of the trilayer structure as per the invention has a distinct interface between PbS QDs and $Bi_2S_3$ NCs. The existence of three different layers is evident in the bulk nanocomposite heterojunction ("BNH") device: a bottom layer of PbS QDs, the intermediate layer of the nanocomposite and the top layer of $Bi_2S_3$ NCs. The SEM imaging according to FIG. 2B shows higher brightness evidenced in the BNH region suggestive of higher packing density of nanocrystals compared to the individual layers (for a given atomic mass number elements), indicative of close-packing and efficient phase mixing of the two material phases.

The benefits of employing a bulk nano-heterojunction (BNH) layer for solar cells are demonstrated in FIGS. 3A, 3B, 4A and 4B.

Figure 3A:
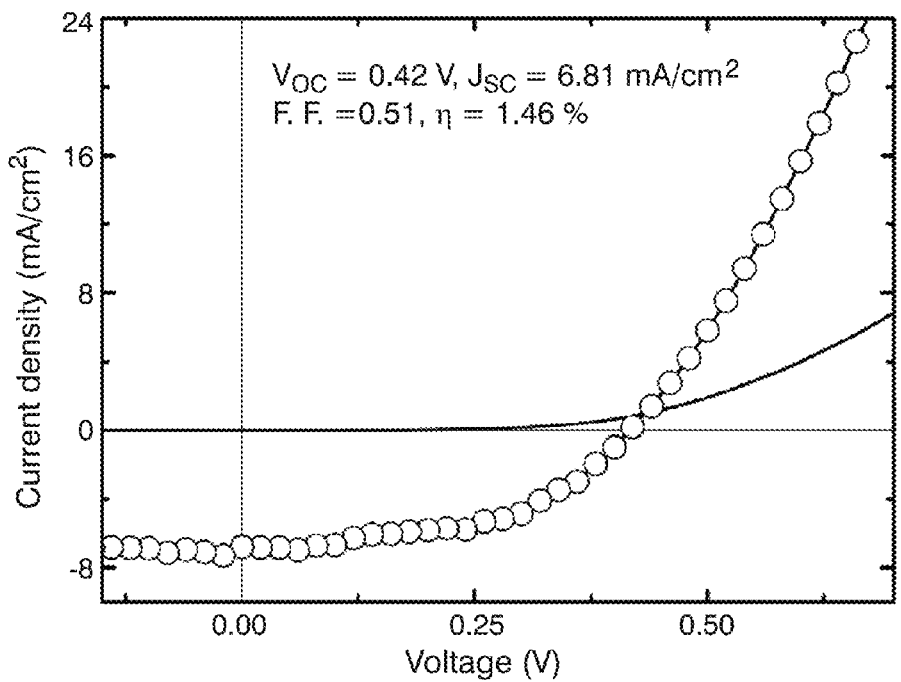
FIG. 3A is a graph showing the result of a solar cell device characterization studies in dark and AM1.5G solar simulated light corresponding to a solar cell device comprising a known bilayer nanocomposite material.
Figure 3B:
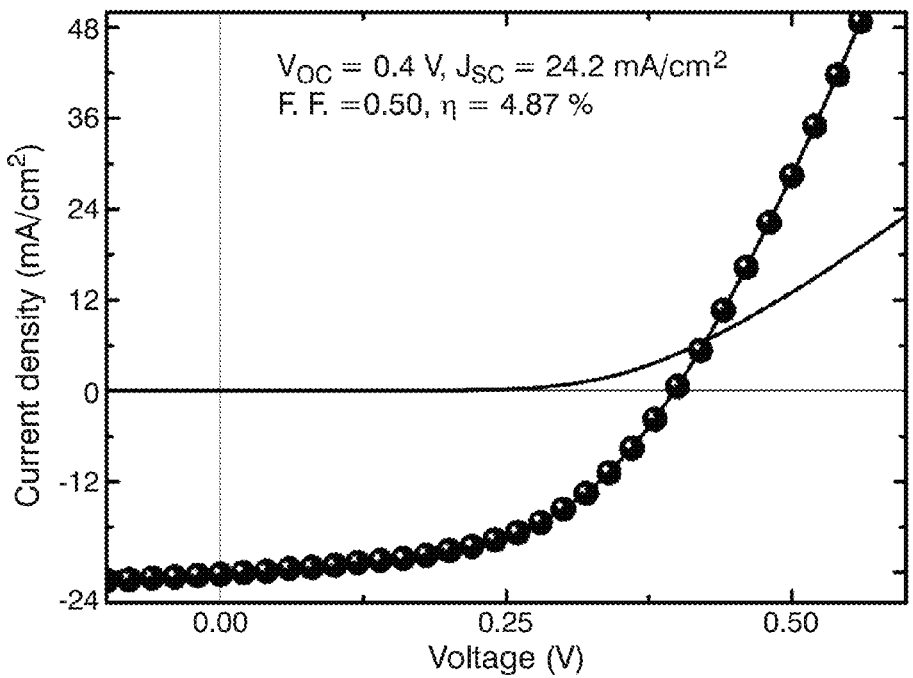
FIG. 3B is a graph showing the result of a solar cell device characterization studies in dark and AM1 5G solar simulated light corresponding to a solar cell device comprising a BNH nanocomposite according to an embodiment of the invention.
Figure 4A:
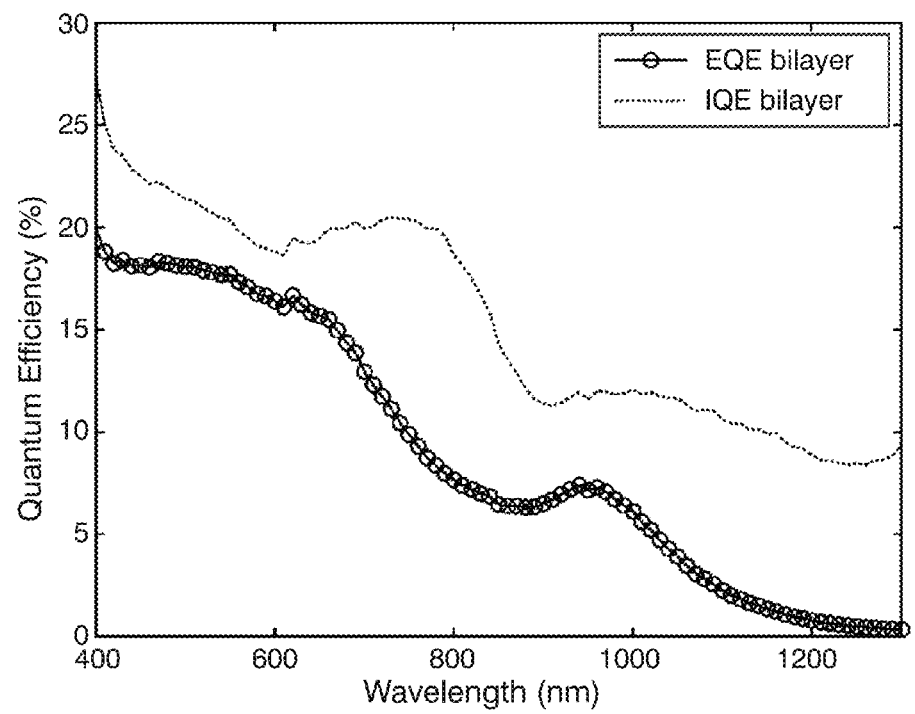
FIG. 4A is a graph showing EQE and IQE spectra for experimentally best performing solar cell devices comprising known bilayer composites.
Figure 4B:
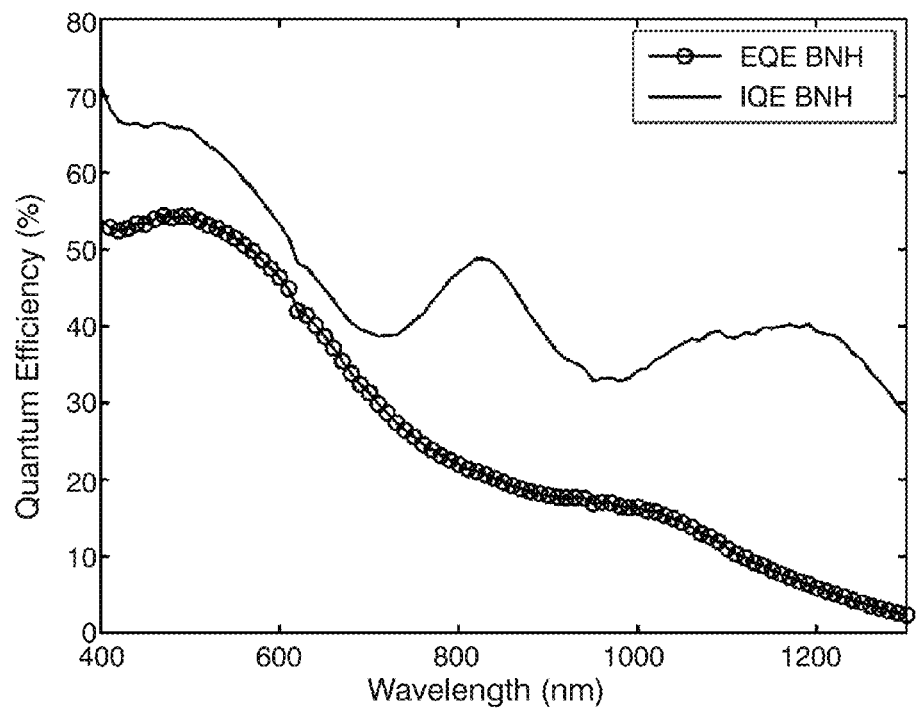
FIG. 4B is a graph showing EQE and IQE spectra for experimentally best performing solar cell devices comprising BNH nanocomposites according to the present invention.
Figure 8A:
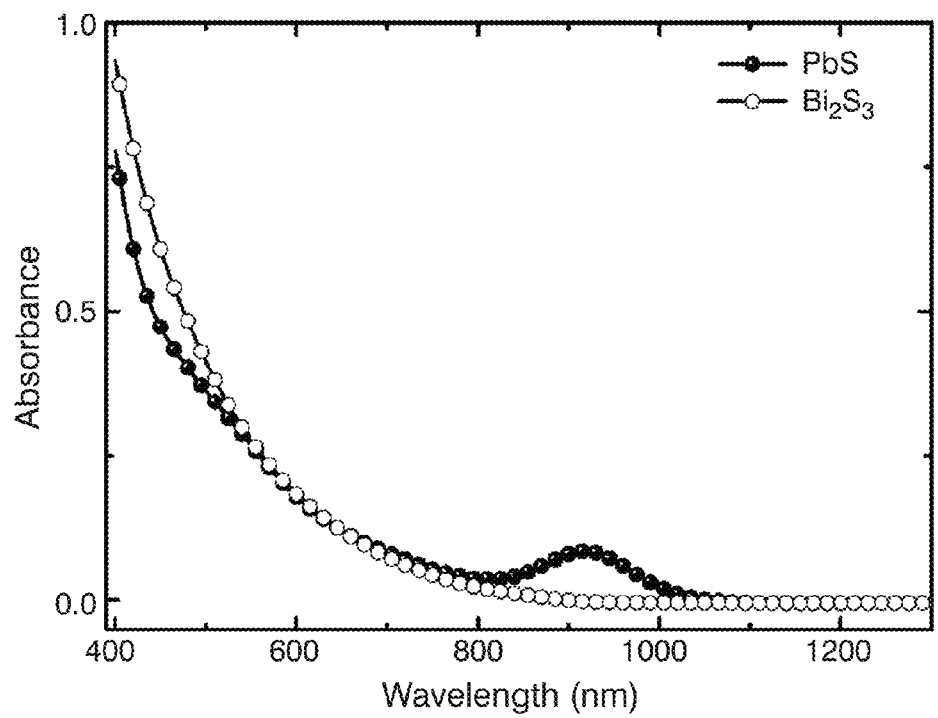
FIG. 8A shows absorbance spectra in solution of PbS quantum dots and $Bi_2S_3$ nanocrystals.
Figure 8B:
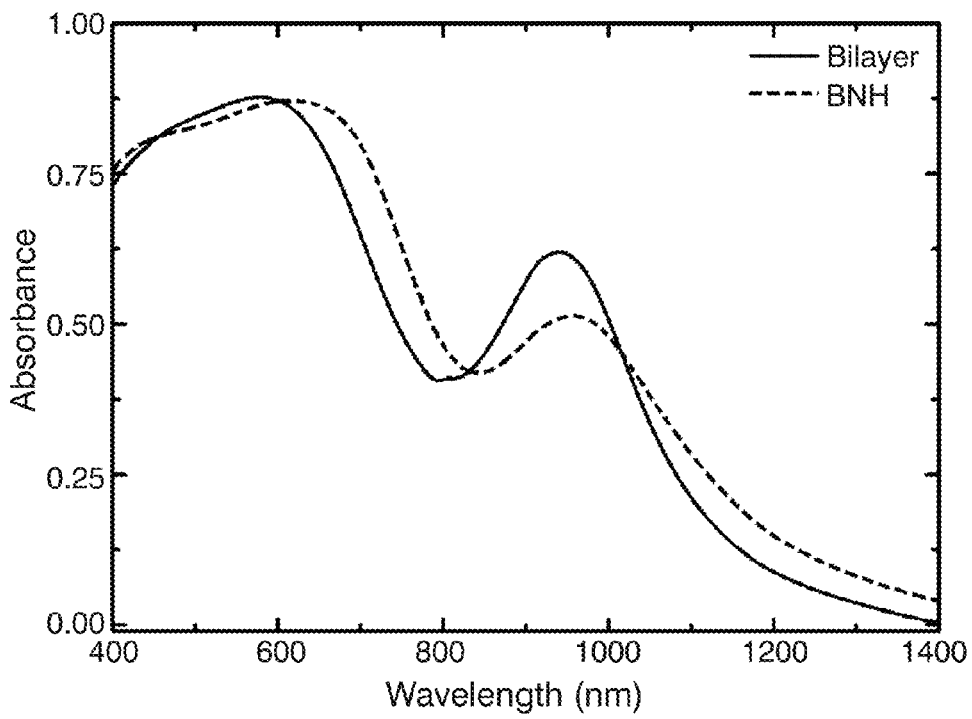
FIG. 8B shows absorbance spectra of the best performing bilayer and BNH devices.

Current voltage characteristics of a bilayer and bulk heterojunction device in dark and under AM1.5G simulated intensity are shown in FIGS. 3A and 3B respectively. Bulk heterojunction devices produce short-circuit current density ($J_{sc}$) in excess of 24 mAcm$^{-2}$, an over three-fold improvement over bilayer devices. The resultant power conversion efficiency (PCE) of the bulk heterojunction device is as high as 4.87%, among the highest reported in colloidal quantum dot based solar cells. FIGS. 4A and 4B show the external quantum efficiency (EQE) and internal quantum efficiency (IQE) of the bilayer and bulk heterojunction devices respectively. An over 3-fold improvement in EQE is achieved in the bulk heterojunction device over the bilayer case. Absorbance spectra of the devices are shown in FIG. 8A which shows absorbance in solution of PbS QDs and $Bi_2S_3$ NCs and in FIG. 8B which shows absorbance of the best performing bilayer and BNH devices used for the determination of IQE. The validity of the EQE spectra is confirmed by the matching of the predicted from the EQE spectra $J_{sc}$ value of 23.4 mAcm$^{-2}$ to the experimentally measured AM1.5G $J_{sc}$ value of ~24 mAcm$^{-2}$.

Figure 5A:
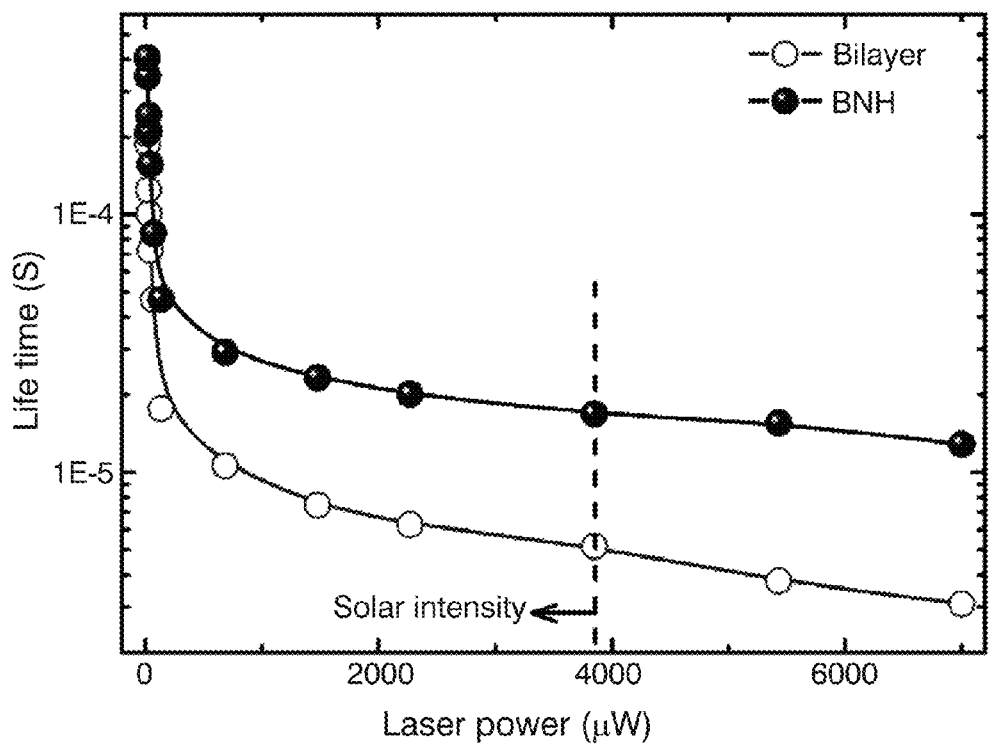
FIG. 5A is a graph showing carrier life dependence on illumination intensity at a wavelength of 635 nm for a known bilayer solar cell device and for a BNH solar cell device according to the present invention.

To verify that efficiency improvement achieved by the present invention is due to efficient charge separation and carrier lifetime prolongation, the carrier lifetime in these devices at various illumination intensities was monitored. FIG. 5A shows the carrier lifetime of a bilayer and bulk heterojunction device extracted by the transient photovoltage upon illumination at 635 nm. Both devices show a progressive decrease in carrier lifetime with increasing illumination intensity as a result of accelerated recombination. While both devices show long lifetimes at low intensity, at higher intensities the bilayer device shows dramatic acceleration of the carrier lifetime. The bulk heterojunction device on the other hand exhibits longer lifetimes and a decrease rate much slower than that of the bilayer device carrier lifetime than the bilayer device due to recombination suppression in the BNH. At solar conditions the BNH device shows carrier lifetime thrice longer than that of the bilayer device.

To further validate the light intensity dependence the $J_{sc}$ of the devices as a function of incident power (FIG. 6A) was measured. As apparent from FIG. 6A, the bilayer device shows strong saturation effects as a result of accelerated recombination in high optical intensities whilst the BNH device shows a linear response indicative of recombination-free operation. The carrier lifetime dependence correlates with the $J_{sc}$ dependence and the BNH device shows a linear response over a large range of intensities. Near solar intensities the $J_{sc}$ in the BNH device is four times higher than the $J_{sc}$ of the bilayer structure. The observed carrier lifetime in the BNH device, of ~20 μs at solar intensity, is attributed to the shorter lifetime of the material components where incident light is absorbed. This is the carrier lifetime in the PbS front layer in accordance with previous reports of carrier lifetime in PbS QD solar cells (Johnston, K. W. et al. Efficient Schottky-quantum-dot photovoltaics: The roles of depletion, drift, and diffusion. *Appl. Phys. Lett.* 92, 122111 (2008)). The BNH structure consisted of ~120 nm of PbS front layer and ~250 nm of BNH layer so that all light is absorbed in the PbS and BNH layers. In the bilayer structure the carrier lifetime, of ~5 µs at solar intensities, is considerably shorter than the BNH device and is associated with recombination in the $Bi_2S_3$ layer. The underlying mechanism of the devices is illustrated by the band diagram in FIG. 5B for the bilayer structure and by the band diagram in FIG. 6B for the BNH structure. The bilayer structure is based on the formation of p-n junction at the interface of the materials as previously reported by Rath, A. K., Bernechea, M., Martinez, L. & Konstantatos, G. Solution-processed heterojunction solar cells based on p-type PbS quantum dots and n-type $Bi_2S_3$ nanocrystals. *Adv. Mater.* 23, 3712-3717 (2011).

Figure 5B:
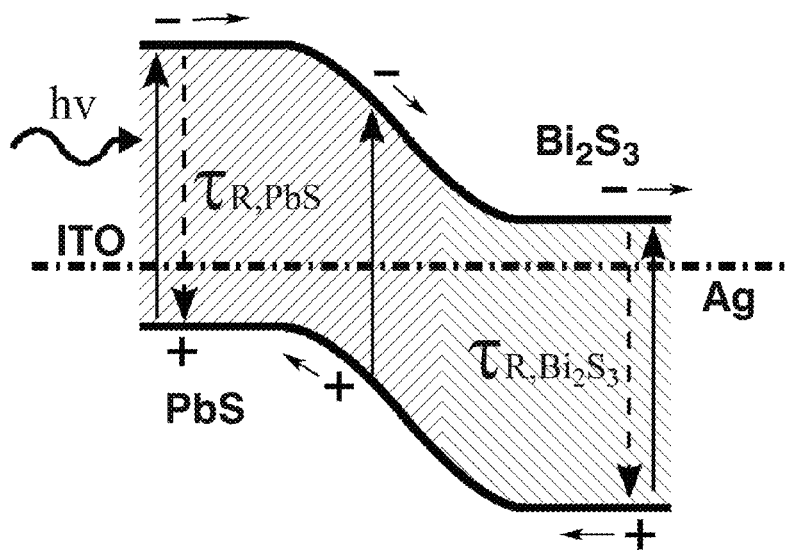
FIG. 5B is a band diagram of the bilayer device.
Figure 6A:
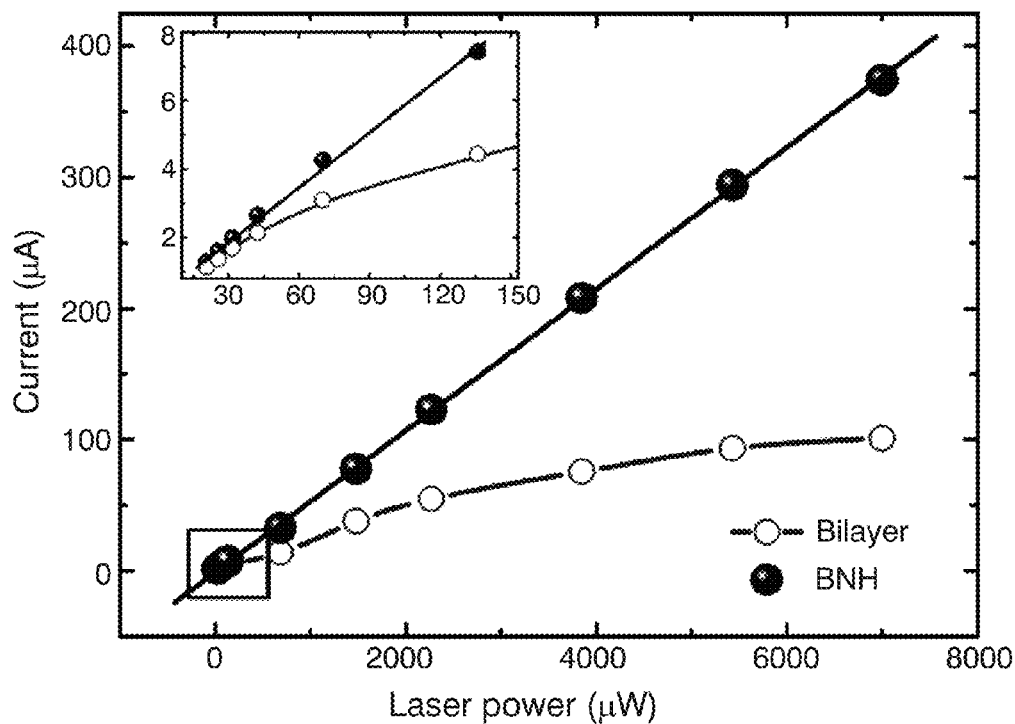
FIG. 6A is a graph showing short circuit dependency on illumination intensity at a wavelength of 635 nm for a known bilayer solar cell device and for a BNH solar cell device according to the present invention.
Figure 6B:
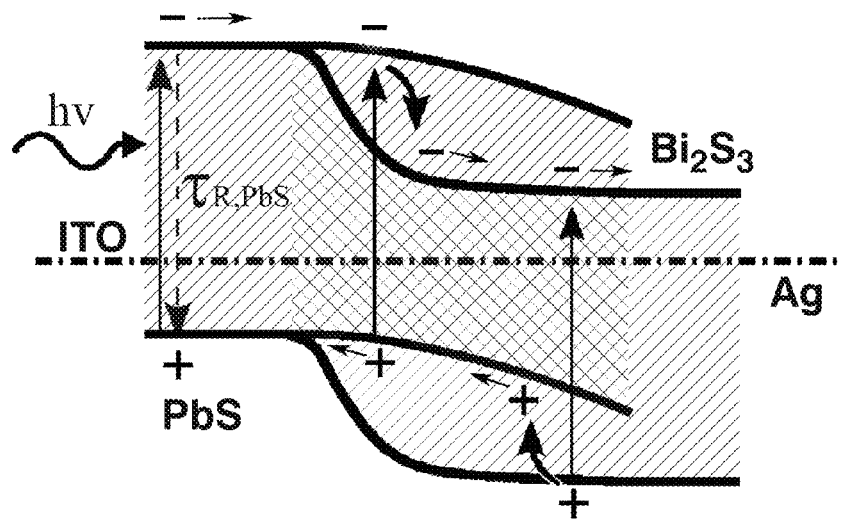
FIG. 6B is a band diagram of the BNH device.

FIG. 5B allows concluding that photogenerated electrons (holes) in the depletion region are drifted towards the quasi-neutral regions (QNR) of $Bi_2S_3$ (PbS) towards the electrodes and that photogenerated carriers in the QNRs diffuse towards their corresponding semiconductor electrodes. FIG. 6B shows a band diagram of a best performing BNH device based on a PbS:$Bi_2S_3$ blend with a ratio of 1:2 w/w. Regarding the BNH device, photogenerated electrons (holes) in the neat PbS layer diffuse and drift towards the BNH layer (the ITO contact). Photogenerated carriers in the BNH layer separate in the two media (electrons in $Bi_2S_3$ and holes in PbS). Electrons traverse the device mainly via diffusion due to the high doping density of $Bi_2S_3$. Holes traverse the device via diffusion and drift in view of the built-in field formed along the PbS phase.

In order to validate this the carrier lifetime of the devices at excitation wavelength of 980 nm where only the PbS phase absorbs light was also monitored using a bilayer device (FIG. 9A) having the structure as described herein above with reference to FIGS. 1A, and 1B, a BNH device (FIG. 9B) having the structure as described herein above with reference to FIGS. 2A and 2B, and a control device (FIG. 9C) which differs from the BNH device in that it does not comprise a PbS layer. The control device comprised a BNH layer comprising PbS and $Bi_2S_3$ in a proportion of 5:1 having a thickness of 240 nm, and a and $Bi_2S_3$ layer having a thickness of 180 nm. PbS:$Bi_2S_3$ ratio of 5:1 was the maximum ratio value that preserved the formation of a junction—as evidenced by rectification—and allowed the measurement of transient Voc. The control device deprived of a pure PbS layer and therefore would allow an estimation of the carrier lifetime of photogenerated carriers in the PbS phase within the BNH layer.

Figure 9D:
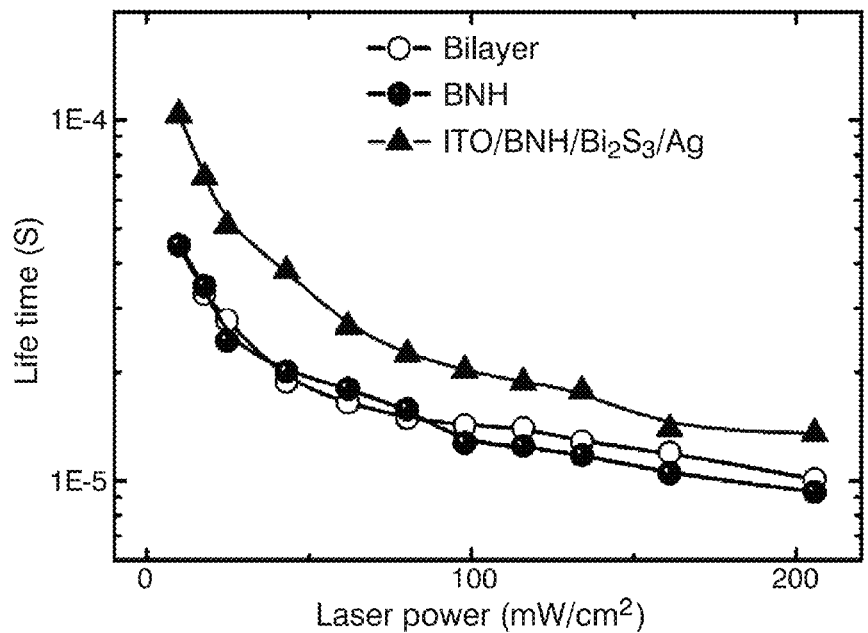
FIG. 9D is a graph showing the respective carrier lifetimes of the devices shown in FIG. 9A-9C upon illumination with 980 nm laser light at various intensities.
Figure 9E:
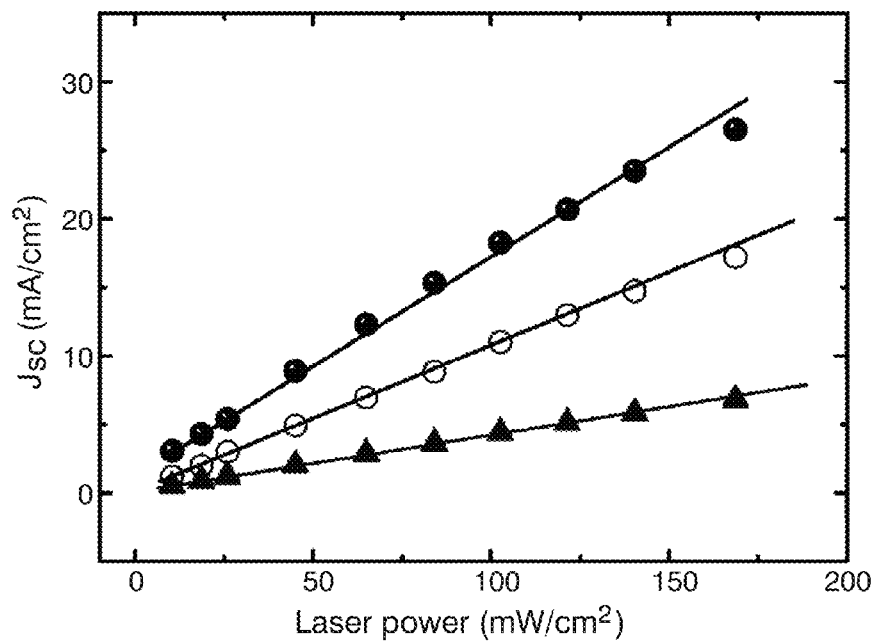
FIG. 9E is a graph shows the short circuit densities of the devices shown in FIGS. 9A-9C as a function of intensity at 980 nm illumination.

FIG. 9D shows the carrier lifetime for the bilayer, the BNH and the control device upon illumination of 980 nm laser light at various intensities. On the other hand, FIG. 9E shows the short-circuit current density of the bilayer, BNH and control device as a function of intensity at 980 nm wavelength illumination. In this case, both bilayer and BNH devices showed similar lifetimes equal to previously reported lifetimes measured in PbS Schottky devices (Johnston, K. W. et al. Efficient Schottky-quantum-dot photovoltaics: The roles of depletion, drift, and diffusion. *Appl. Phys. Lett.* 92, 122111 (2008)).

Upon monitoring he carrier lifetime at excitation wavelength of 980 nm, it was monitored and it was found that carrier lifetime in this structure is by 60% longer when compared to the bilayer device demonstrating thus the benefit of the BNH in the prolongation of the photogenerated carriers' lifetime.

Figure 10:
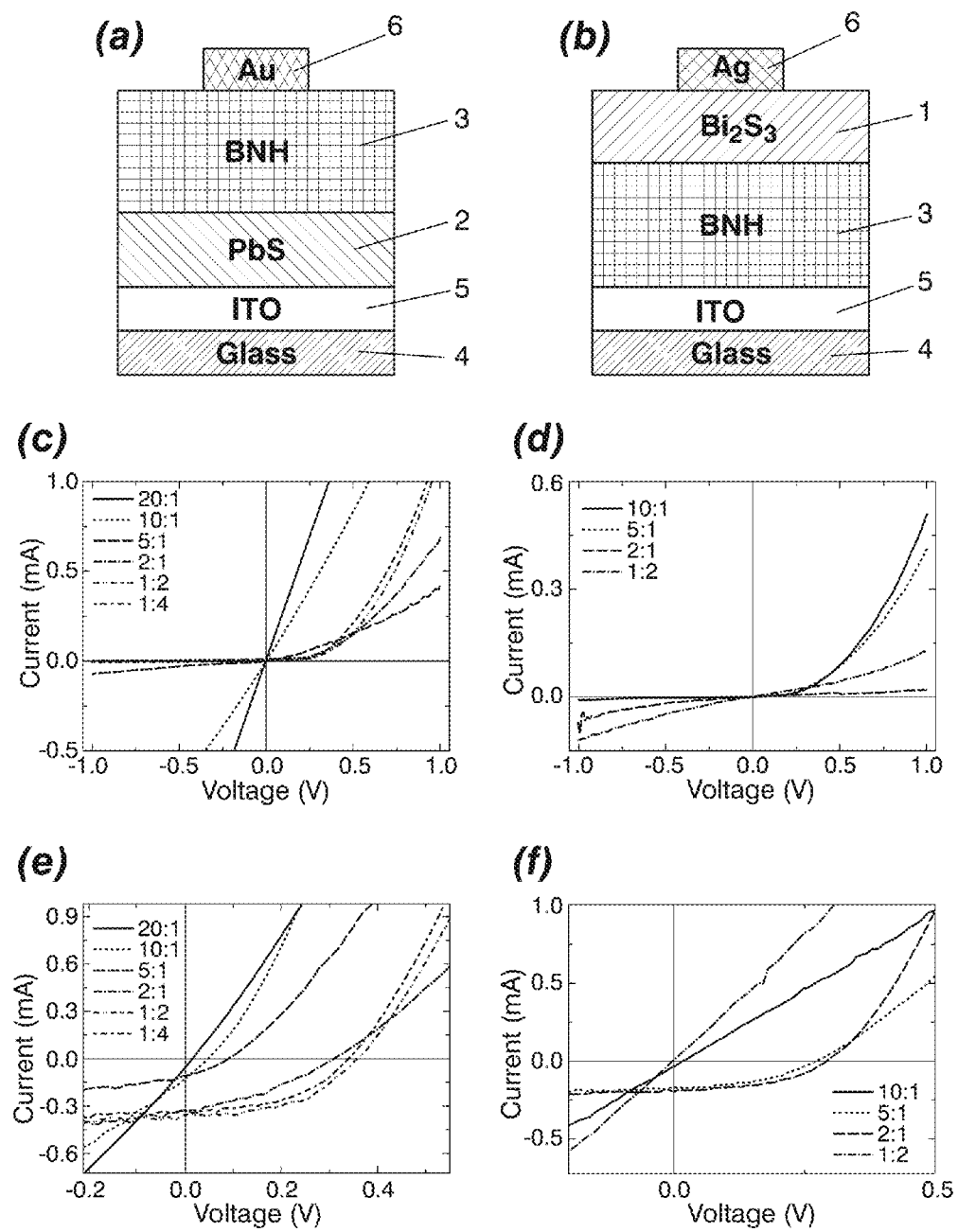
FIG. 10 schematically shows a control device and a BNH device used to determine characteristics at light and dark conditions for different blend ratios in ITO/PbS/BNH/Au and ITO/BNH/PbS/Ag configurations, and graphs showing the results of the determinations.

Bilayer devices comprising a BNH layer of various concentrations of PbS:$Bi_2S_3$ coated directly onto an ITO bottom electrode layer arranged on a glass substrate, an overlayer of $Bi_2S_3$ (image "b" in FIG. 10) and a silver top electrode were prepared, as well as devices with a BNH layer and an underlayer of PbS QDs (image "a" in FIG. 10) coated onto an ITO bottom electrode layer arranged on a glass substrate, with a gold top electrode and lacking a $Bi_2S_3$ overlayer. Graphs (c)-(f) in FIG. 10, show the I-V characteristics of the devices having different blend ratios at dark (graphs (c) and (d)) and under light condition are shown in (graphs (e) and (f)). Different PbS/$Bi_2S_3$ ratios are shown in the graphs. As evidenced by the graphs strong rectification at the best performing ratio of PbS:$Bi_2S_3$ for the BNH is observed in contact with the PbS layer, whereas there is no junction formation of this BNH with the $Bi_2S_3$ NC layer. Graph (e) shows a progressive decrease of $V_{oc}$ with increasing concentration of $Bi_2S_3$ in a PbS-dominated BNH followed by a decrease in the turn-on voltage under dark (shown in graph (c)). As apparent, devices based on the optimal ratio of PbS:$Bi_2S_3$ 1:2 demonstrated rectification and photovoltaic response while in contact with a PbS layer but not with $Bi_2S_3$ layer. This is in accordance with the higher n-type doping of $Bi_2S_3$ NCs of $8\times10^{16}$ cm$^{-3}$ compared to the less heavily doped PbS QDs with p-type doping of $\sim10^{16}$ cm$^3$.

Figure 11:
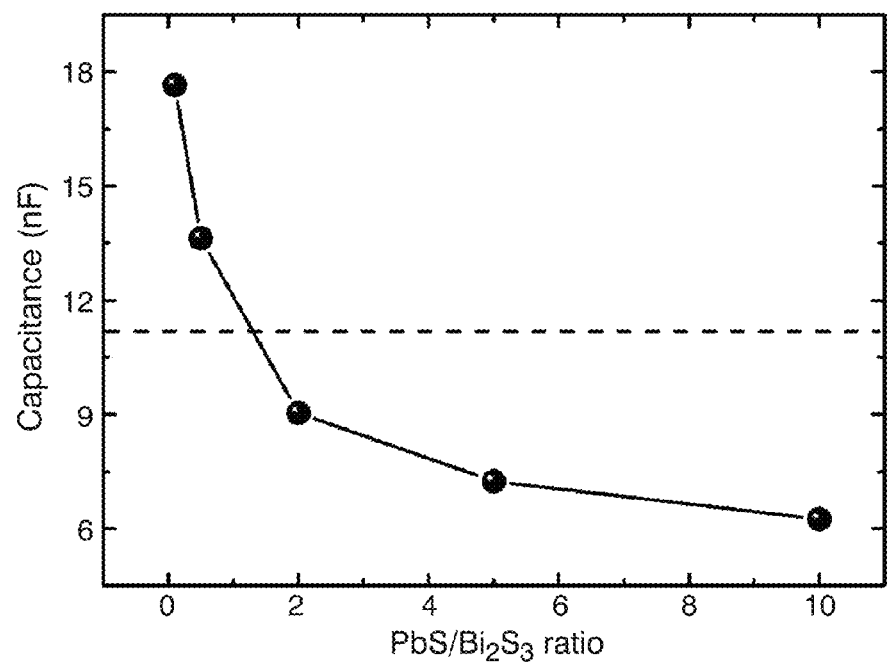
FIG. 11 is a graph showing capacitance at zero bias for different $PbS:Bi_2S_3$ ratio in BNH and bilayer device configurations.

A BNH material is thus expected to create a nearly depleted PbS phase within the BNH whereas the $Bi_2S_3$ phase remains doped. Cap-V spectroscopy indeed showed a progressive decrease of short-circuit capacitance for devices of the same thickness with increasing PbS:$Bi_2S_3$ ratio. In this respect, FIG. 11 shows the capacitance at zero bias of BNH devices having different PbS/$Bi_2S_3$ ratios and the dashed line indicates capacitance at zero bias of bilayer device for comparison. The BNH device comprises 90 nm PbS/270 nm BNH/40 nm $Bi_2S_3$ and the bilayer device comprises 360 nm PbS/40 nm $Bi_2S_3$ layer. The dashed line corresponds to a device with a $Bi_2S_3$:PbS ratio equal to 0. Total thickness of 400 nm was kept constant for both structures. As apparent, the capacitance decreases with increasing ratio of PbS QD to $Bi_2S_3$ suggesting the formation of a more intrinsic BNH layer. This is suggestive that the BNH approach may allow for controlled doping compensation of nanocomposite materials an approach that in the past has resulted only in increasing doping in binary quantum dot nanocomposites (Urban, J. J., Talapin, D. V., Shevchenko, E. V., Kagan, C. R. & Murray, C. B. Synergism in binary nanocrystal superlattices leads to enhanced p-type conductivity in self-assembled PbTe/$Ag_2$Te thin films. *Nature Mater.* 6, 115-121 (2007); Ko, D.-K., Urban, J. J. & Murray, C. B. Carrier distribution and dynamics of nanocrystal solids doped with artificial atoms. *Nano Lett.* 10, 1842-1847 (2010)).

Figure 7:
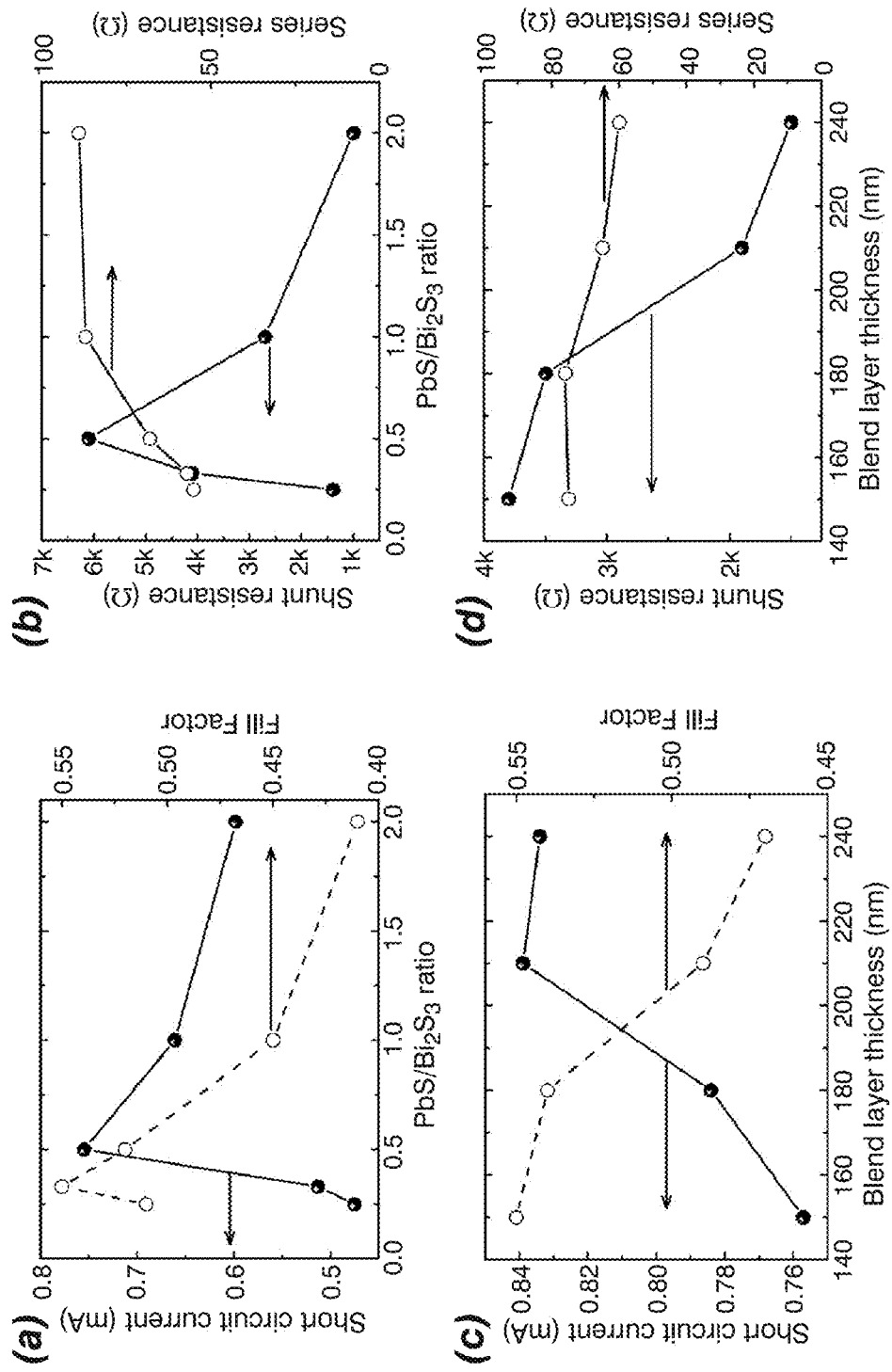
FIG. 7 shows graphs resulting from optimization studies.

Graph (a) in FIG. 7 shows the $I_{sc}$ and FF dependence on the w/w ratio of PbS QDs to $Bi_2S_3$ NCs. An optimum ratio of ~1:2 PbS:$Bi_2S_3$ yields maximum $I_{sc}$ and FF, suggestive of the formation of a continuous percolation path that allows the efficient transport of carriers and minimizes recombination as shown in graph b of FIG. 7 where shunt resistance $R_{sh}$ maximizes at a ratio of 1:2 and the series resistance $R_s$ remains as low as 60 Ohm. It may be noted that the best performing device consists of a nearly depleted PbS phase and quasi-neutral $Bi_2S_3$ phase.

Further performance enhancement could be expected in the case of more balanced-doped initial materials that would allow the concurrent fulfillment of a fully-depleted structure and continuous percolation path for both phases to allow efficient carrier extraction. In the present device, electron extraction predominantly takes place via diffusion of electrons through the $Bi_2S_3$ phase and drift and diffusion of holes via the PbS phase. The limiting mechanism is expected to arise from electron diffusion which for electron mobility of ~$10^{-4}$ cm² µs in the $Bi_2S_3$ phase the diffusion length is estimated ~90 nm considering a lifetime of ~20 µs, this is in accordance with the ~40-50% IQE observed for a 160 nm thick BNH device. Graph (c) in FIG. 7 shows the dependence of $I_{sc}$ as a function of the thickness of the nanocomposite layer. $I_{sc}$ increases with increasing thickness as a result of the efficient carrier extraction from the nanocomposite layer for a thickness up to 200 nm. Beyond 200 nm the $I_{sc}$ slightly decreases as a result of recombination taking over charge transport, also evidenced by the progressive decrease of fill factor of the devices followed by the decrease in $R_{sh}$ as a result of increasing recombination.

Figure 12:
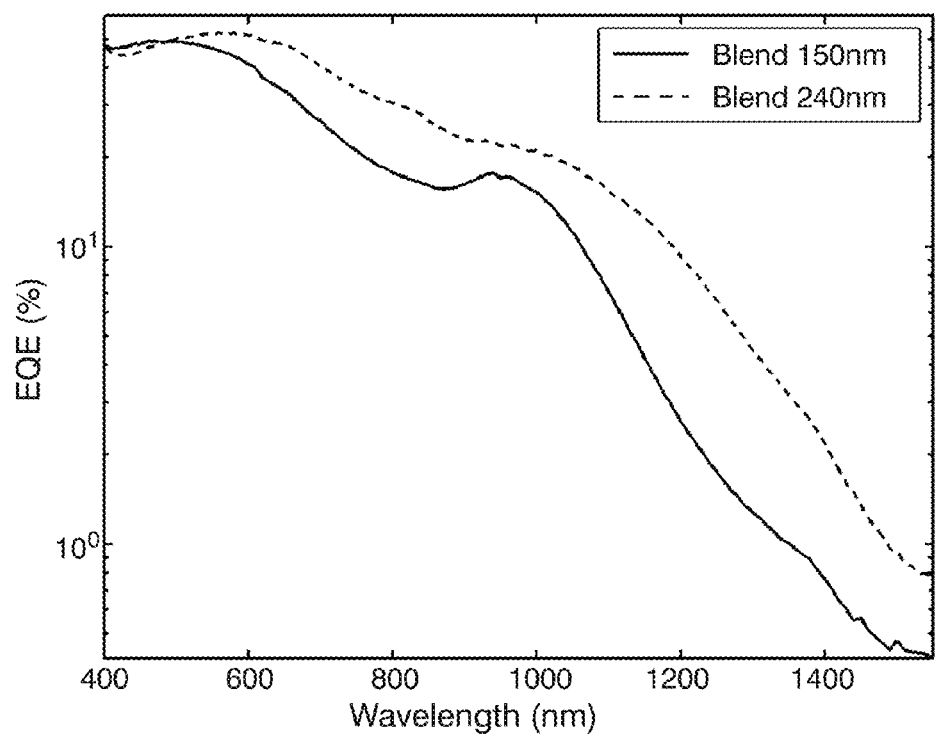
FIG. 12 is a graph showing EQE spectra for different thickness of the BNH layer.

The contribution of the BNH layer to the photocurrent is apparent from FIG. 12 which shows EQE spectra for BNH devices with blend thicknesses of 150 nm and 240 nm respectively. The EQE increases in the long wavelengths with increasing thickness of the BNH as a result of more efficient absorption in the PbS QDs within the BNH layer. The onset of EQE for the devices is found at a wavelength of ~1.5 µm pointing to an effective bandgap of PbS QDs of 0.8 eV, significantly reduced from the initial bandgap of 1.3 eV (exciton peak at ~950 nm) as a result of efficient electronic coupling of the close-packed QD film. There is thus an increasing EQE in the longer wavelengths with increasing thickness of the BNH. It should also be noted that despite the initial exciton peak of quantum dots at 920 nm the resultant devices show sensitization in wavelengths longer than 1300 nm, thus the effective bandgap of the QDs has decreased as a result of efficient electronic coupling, a phenomenon previously reported for close-packed electronically coupled quantum dot solids (Talapin, D. V. & Murray, C. B. PbSe nanocrystal solids for n- and p-channel thin film field-effect transistors. *Science* 310, 86-89 (2005)).

The invention claimed is:

1. A photovoltaic nanocomposite comprising a film of solution processed semiconductor materials comprising a n-type material selected from n-type quantum dots and n-type nanocrystals, and a p-type material selected from p-type quantum dots and p-type nanocrystals, wherein
    the n-type material has a conduction band level at least equal, compared to vacuum level, to that of the p-type material,
    the p-type material has a valence band at the most equal, compared to vacuum level, to that of the n-type material, and
at least a portion of the n-type material and at least a portion of the p-type material are present in a bulk nano-heterojunction binary nanocomposite layer comprising a blend of the n-type material and the p-type material
wherein
    the nanocomposite layer is an interphase comprising said n-type material and said p-type material, sandwiched between an electron blocking layer of a p-type material and a hole blocking layer of a n-type material, such that the nanocomposite has a trilayer structure;
    the n-type material in the hole blocking layer has a conduction band at least as large as, compared to vacuum, that of the n-type material in the nanocomposite layer and a valence band at the most as large as, compared to vacuum, that the p-type material in the nanocomposite layer; and
    the p-type material in the electron blocking layer has a valence band at the most as large as, compared to vacuum, that of that of the p-type material in the nanocomposite layer and a conduction band at the most as large as, compared to vacuum, that of both the p-type and n-type materials in the nanocomposite layer.

2. A photovoltaic nanocomposite according to claim 1, wherein the n-type material in the hole blocking layer is the same material as the n-type material in the nanocomposite layer.

3. A photovoltaic nanocomposite according to claim 1, wherein the p-type material in the electron blocking layer is the same material as the p-type material in the nanocomposite layer.

4. A photovoltaic nanocomposite according to claim 1, wherein the n-type material in the hole blocking layer is a n-type material different from the n-type material in the nanocomposite layer.

5. A photovoltaic nanocomposite according to claim 1, wherein the p-type material in the electron blocking layer is a p-type material different from the p-type material in the nanocomposite layer.

6. A photovoltaic nanocomposite according to claim 1, wherein the p-type material and the n-type material are present in a proportion which enables the formation of a continuous percolation path along the two material phases.

7. A photovoltaic nanocomposite according to claim 6, wherein the p-type material and the n-type material are present in a proportion of 1:100 to 100:1 by weight.

8. A photovoltaic nanocomposite according to claim 1, wherein the nanocomposite has a carrier doping density which is lower than the corresponding doping densities of the individual constituent semiconductor materials.

9. A photovoltaic nanocomposite according to claim 1, wherein the nanocomposite layer has a carrier doping density lower than carrier doping densities of any of the n-type material and the p-type material comprised in a hole blocking layer and in an electron blocking layer whereby a nearly intrinsic layer can be formed and a p-i-n structure is developed.

10. A photovoltaic nanocomposite according to claim 1, wherein the n-type material comprises n-type nanocrystals made of a semiconductor comprising at least one of $Bi_2S_3$, $FeS_2$ (pyrite), FeS, iron oxide, ZnO, $TiO_2$, copper sulfide, PbS, PbSe, PbTe, CdSe, CdS, Si, Ge, copper zinc tin sulfide (CZTS), HgTe, CdHgTe and copper indium gallium diselenide (CIGS).

11. A photovoltaic nanocomposite according to claim 1, wherein the p-type material comprises at least one of $Bi_2S_3$, PbS, PbSe, PbTe, $Cu_2O$, CZTS, CIGS, copper sulfide, Si, Ge, $FeS_2$ and FeS, HgTe, CdHgTe.

12. A solar cell device comprising a substrate, a bottom electrode layer made of a transparent conductive material coated on the substrate, a photovoltaic nanocomposite comprising a film of solution processed semiconductor materials comprising a n-type material selected from n-type quantum dots and n-type nanocrystals, and a p-type material selected from p-type quantum dots and p-type nanocrystals, coated on the electrode layer, and at least one top electrode provided on the film, wherein the film is made of a photovoltaic nanocomposite as defined in claim 1.

13. A solar cell device according to claim 12, wherein the transparent conductive material comprises at least one of indium tin oxide, aluminum doped zinc oxide and graphene.

14. A solar cell device according to claim 12, further comprising an interfacial ultrathin buffer layer introduced between the film and the top electrode to facilitate passivation of the interface and suppression of recombination.

15. A solar cell device according to claim 14, wherein the buffer layer made of a material comprising at least one of ZnO, $TiO_2$, LiF and $MoO_x$ and including a thickness within a range from 0.1 to 5 nm.

16. A photodiode device for detecting photons and x-rays, comprising the photovoltaic nanocomposite defined in claim 1 as a photodiode.

17. A photovoltaic nanocomposite comprising a film of solution processed semiconductor materials comprising a n-type material selected from n-type quantum dots and n-type nanocrystals, and a p-type material selected from p-type quantum dots and p-type nanocrystals, wherein
- the n-type material has a conduction band level at least equal, compared to vacuum level, to that of the p-type material,
- the p-type material has a valence band at the most equal, compared to vacuum level, to that of the n-type material, and
- at least a portion of the n-type material and at least a portion of the p-type material are present in a bulk nano-heterojunction binary nanocomposite layer comprising a blend of the n-type material and the p-type material, wherein
- the nanocomposite layer is an interphase comprising said n-type material and said p-type material, sandwiched between an electron blocking layer of a p-type material and a hole blocking layer of a n-type material, such that the nanocomposite has a trilayer structure;
- the electron blocking layer has a thickness ranging from 10 to 500 nm,
- the hole blocking layer has a thickness ranging from 10 to 500 nm,
- the nanocomposite layer has a thickness ranging from 100 to 2000 nm; and wherein
- the n-type material in the hole blocking layer has a carrier doping density at least as large as that of the n-type material in the nanocomposite layer, a conduction band at least as large as that of that of the n-type material in the nanocomposite layer and a valence band at the most as large as that of both the p-type and n-type materials in the nanocomposite layer; and
- the p-type material in the electron blocking layer has a carrier doping density at least as large as that of the p-type material in the nanocomposite layer, a valence band at the most as large as that of that of the p-type material in the nanocomposite layer and a conduction band at the most as large as that of both the p-type and n-type materials in the nanocomposite layer.

\* \* \* \* \*